US006916744B2

(12) United States Patent
Achutharaman et al.

(10) Patent No.: US 6,916,744 B2
(45) Date of Patent: *Jul. 12, 2005

(54) METHOD AND APPARATUS FOR PLANARIZATION OF A MATERIAL BY GROWING A SACRIFICIAL FILM WITH CUSTOMIZED THICKNESS PROFILE

(75) Inventors: Vedapuram S. Achutharaman, San Jose, CA (US); Juan Chacin, Palo Alto, CA (US); Hali Forstner, Belmont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 171 days.

This patent is subject to a terminal disclaimer.

(21) Appl. No.: 10/325,673

(22) Filed: Dec. 19, 2002

(65) Prior Publication Data

US 2004/0121598 A1 Jun. 24, 2004

(51) Int. Cl.[7] .............................................. H01L 21/311
(52) U.S. Cl. ...................................... 438/694; 438/700
(58) Field of Search ................................. 438/694, 700, 438/702, 703, 743, 745

(56) References Cited

U.S. PATENT DOCUMENTS

| | | | |
|---|---|---|---|
| 4,154,192 A | * 5/1979 | Tsubouchi et al. ........... 118/715 |
| 4,992,306 A | * 2/1991 | Hochberg et al. ......... 427/255.29 |
| 5,468,670 A | 11/1995 | Ryou ........................... 437/52 |
| 5,489,557 A | 2/1996 | Jolley |
| 5,633,212 A | 5/1997 | Yuuki |
| 5,693,578 A | 12/1997 | Nakanishi et al. |
| 5,722,157 A | 3/1998 | Shouji et al. ............. 29/603.14 |
| 5,777,300 A | 7/1998 | Homma et al. |
| 5,851,892 A | 12/1998 | Lojek et al. |
| 5,862,057 A | * 1/1999 | Xia et al. ...................... 716/21 |
| 6,037,273 A | 3/2000 | Gronet et al. |
| 6,100,132 A | * 8/2000 | Sato et al. ................... 438/243 |
| 6,265,286 B1 | 7/2001 | Boyer et al. |
| 6,306,727 B1 | * 10/2001 | Akram ....................... 438/444 |
| 6,458,708 B1 | 10/2002 | Jin ............................ 438/703 |
| 6,492,283 B2 | * 12/2002 | Raaijmakers et al. ....... 438/770 |
| 6,528,387 B1 | * 3/2003 | Moriyasu et al. ........... 438/404 |
| 6,589,877 B1 | 7/2003 | Thakur |
| 2002/0104822 A1 | * 8/2002 | Naydenkov et al. .......... 216/24 |
| 2003/0015706 A1 | 1/2003 | Morimoto |
| 2004/0121605 A1 | * 6/2004 | Maydan et al. ............. 438/694 |

FOREIGN PATENT DOCUMENTS

| | | | |
|---|---|---|---|
| JP | H11-251599 | 9/1999 | |
| JP | 2002-33470 | 1/2002 | |
| JP | 2002-261275 | 9/2002 | |
| TW | 434793 | 5/2001 | ........... H01L/21/76 |

OTHER PUBLICATIONS

PCT Search Report dated May 19, 2004 for PCT/US03/39247 (AMAT/8013PC).

* cited by examiner

Primary Examiner—Kin-Chan Chen
(74) Attorney, Agent, or Firm—Moser, Patterson & Sheridan, LLP

(57) ABSTRACT

A method and apparatus for the formation of oxide in a manner having a planarizing effect on underlying material, e.g., silicon. In particular, an oxide having a nonuniform thickness profile is grown on the underlying material. The nonuniform thickness profile of the oxide is selected according to the nonuniform profile of the underlying material. Subsequent removal of the oxide leaves behind a planarized surface of the underlying material, as compared to the pre-oxidized surface.

19 Claims, 20 Drawing Sheets

METHOD AND APPARATUS FOR PLANARIZATION OF A MATERIAL BY GROWING A SACRIFICIAL FILM WITH CUSTOMIZED THICKNESS PROFILE

BACKGROUND OF THE INVENTION

1. Field of the Invention

Embodiments of the present invention generally relate to processing substrates. More particularly, embodiments of the invention relate to planarizing a layer by oxidation and removal of the same.

2. Description of the Related Art

In the fabrication of integrated circuits and other electronic devices, multiple layers of conducting, semiconducting, and dielectric materials are deposited on or removed from a surface of a substrate. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electro-chemical plating (ECP).

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization is also useful in forming features on a substrate by removing excess deposited material used to fill the features and to provide an even surface for subsequent levels of metallization and processing. Further, planarization is critical to ensuring proper focusing of photolithography equipment.

Conventional polishing techniques used to planarize wafers include Chemical Mechanical Polishing (CMP), Electro Chemical Mechanical Polishing (ECMP) and the like. Both CMP and ECMP utilize a polishing pad for polishing wafers in a fluid environment. Typically, a substrate carrier or polishing head is mounted on a carrier assembly and positioned in contact with the polishing pad. The carrier assembly provides a controllable pressure to the substrate, thereby pressing the substrate against the polishing pad. The pad is moved relative to the substrate by an external driving force. Polishing is effected by chemical activities, electrical and/or mechanical activities.

However, in some cases conventional polishing techniques have proven inadequate. One example is in the case of a silicon wafer or substrate. Examples of silicon wafers include Epitaxial (epi) wafers and Silicon-On-Insulator (SOI) wafers. Such wafers are normally polished using techniques like CMP, although other methods may also be used. However, while such conventional polishing techniques eliminate nanometer size surface roughness, they can introduce other surface non-uniformities and leave a film with unacceptable variations in thickness.

Therefore, there is a need for a method and apparatus for planarizing materials, particularly silicon.

SUMMARY OF THE INVENTION

The present invention generally relate to the formation of a sacrificial planarizing film.

One embodiment provides a method of growing a sacrificial planarization layer on a material forming an upper surface of a semiconductor wafer. The method comprises determining a non-uniform thickness profile of the material; selecting one or more process parameter values based on the non-uniform thickness profile in order to planarize the material; and growing, by wet oxidation, the sacrificial planarization layer on the upper surface of the wafer according to the non-uniform profile, wherein the sacrificial planarization layer consumes a portion of the material to effect planarization thereof.

Another embodiment provides a method of planarizing a wafer material having a non-uniform topography profile. The method comprises placing a wafer in a chamber; establishing an steam-containing environment to cause planarizing consumption of the wafer material according to the non-uniform topography profile; exposing the wafer to the steam-containing environment, whereby a sacrificial planarization layer is formed on the wafer material; and removing the sacrificial planarization layer. In this context, "planarizing consumption" refers to the planarization achieved at the interface between the wafer material and the sacrificial planarization layer, resulting in a relatively more planar surface of the wafer material upon removal of the sacrificial planarization layer.

Another method of planarizing a wafer material having a non-uniform topography comprises placing a wafer in a chamber, growing the sacrificial planarization layer on the wafer material according to the non-uniform topography to cause planarizing consumption of the wafer material and removing the sacrificial planarization layer. Growing the sacrificial planarization layer may comprise (a) exposing the wafer to a first oxygen-containing environment at a chamber pressure selected to cause the planarizing consumption of the wafer material, while maintaining a substantially constant temperature profile across the wafer; and (b) exposing the wafer to a second oxygen-containing environment while maintaining a non-uniform temperature profile across the wafer to cause the planarizing consumption of the wafer material.

Yet another method of planarizing a wafer comprising a wafer material having a non-uniform topography profile comprises placing the wafer in a chamber; flowing an oxygen-containing fluid into the chamber to create an oxygen-containing environment in the chamber; exposing the wafer to the oxygen-containing environment; controlling wafer temperature and at least one of chamber pressure and flow rate of the oxygen-containing fluid to cause planarizing consumption of the wafer material according to the non-uniform topography profile and cause formation of the sacrificial planarization layer on the wafer material; and removing the sacrificial planarization layer.

Yet another method of planarizing an upper silicon-containing layer of a wafer comprises determining a target oxide profile of the wafer; based on the target oxide profile, selecting one or more process parameter values, wherein the process parameter values are selected from at least one of a chamber pressure and an oxygen-containing fluid flow rate; placing the wafer in an oxide growth chamber; flowing the oxygen-containing fluid into the chamber at a flow rate of between about 10 SLM and about 40 SLM to create an oxygen-containing environment in the chamber at a chamber pressure of less than about 100 Torr, preferably less than 30 Torr and most preferably between about 6 Torr and about 14 Torr; maintaining the chamber pressure and the wafer temperature in the oxide growth for a period of time between about 30 seconds and a few minutes (preferably less than or equal to about 90 seconds) to allow consumption of a portion of the silicon-containing layer to cause planarizing consumption of the silicon-containing layer according to the target oxide profile and cause formation of the sacrificial planarization layer; and removing the sacrificial planarization layer. In one embodiment, the oxygen-containing fluid has between about 10% and about 33% $H_2$.

Still another embodiment provides a system comprising an oxide growth chamber; a wafer support member adapted to support a wafer having a material with a non-uniform topography profile; a fluid delivery system fluidly coupled to the oxide growth chamber; and a controller system configured to receive as input a target oxide profile and to control at least: (i) a flow rate of one or more fluids from the fluid delivery system to create an oxygen-containing environment in the oxide growth chamber; and (ii) a chamber pressure. At least one of the flow rate and the chamber pressure are selected to consume the material on the wafer according to the target oxide profile, whereby a sacrificial planarization layer is formed on the material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
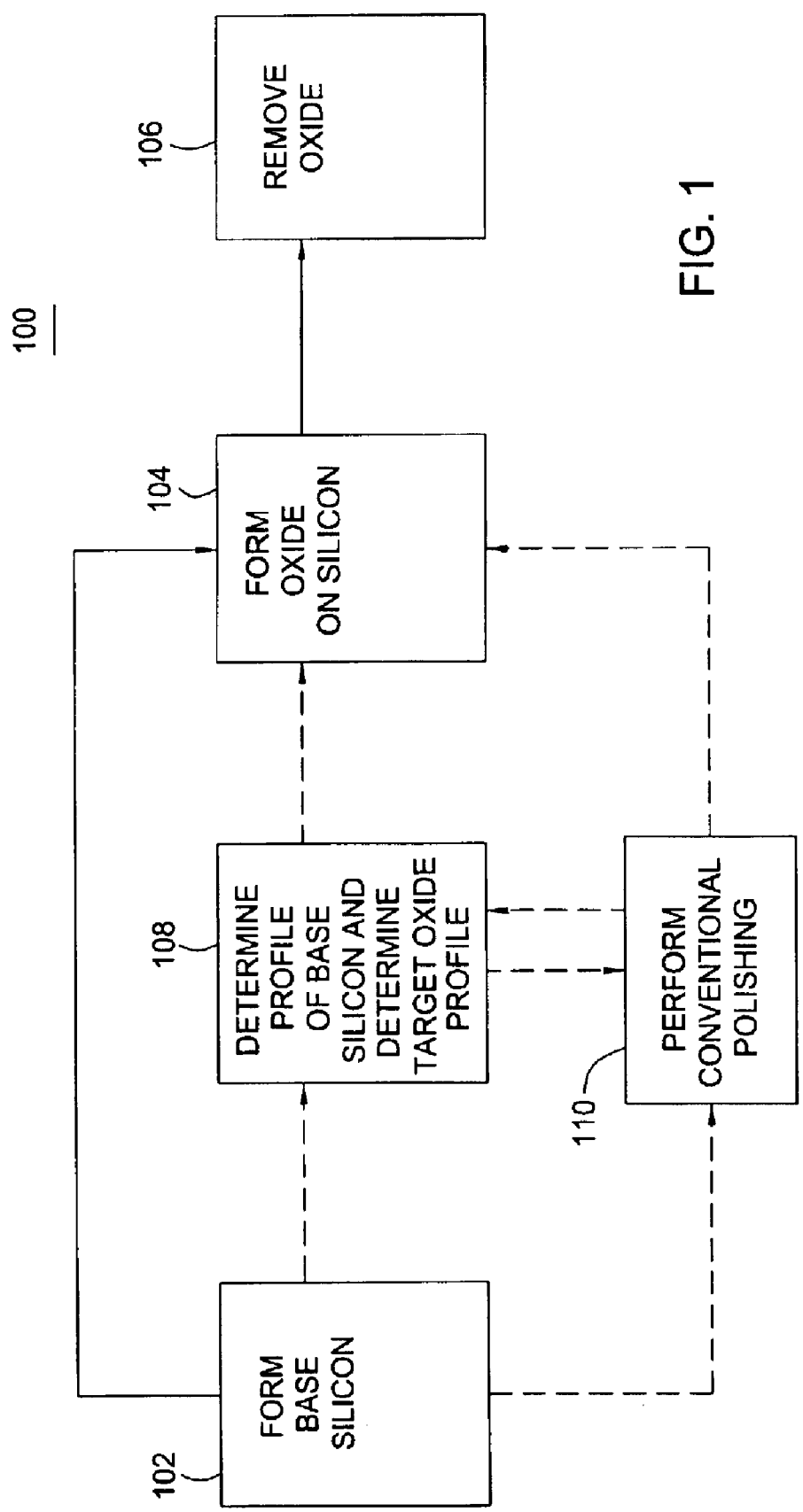
FIG. 1 is a flow chart illustrating one embodiment of a method for growing and removing a sacrificial oxide.

The present invention describes a method and apparatus for an in situ oxidation process and subsequent oxide removal. In the following description numerous specific details such as apparatus configurations as well as process specifics such as time, pressure, flow and temperature are set forth in order to provide a thorough understanding of the present invention. For example, by way of illustration, planarization techniques will be described with respect to SOI and Epi wafers. One skilled in the art will appreciate the ability to use alternative wafer types, configurations and process details without departing from the scope of the present invention. In other instances, well-known semiconductor processing equipment and techniques have not been described in detail in order to not unnecessarily obscure the present invention. Further, the process parameter values disclosed herein are merely illustrative. Persons skilled in the art readily recognize that such values vary significantly depending on the particular environment. As such, a comprehensive list of possible values and conditions is neither practical nor necessary, as such values can be determined once the principles of the present invention are known.

Embodiments of the invention generally provide for the formation of oxide in a manner having a planarizing effect on underlying material, e.g., silicon. In particular, an oxide having a nonuniform thickness profile is grown on the underlying material. Growth of the oxide is achieved by consuming a portion of the underlying material and replacing the consumed portion with the oxide. The nonuniform thickness profile of the oxide to be grown is selected according to the nonuniform profile of the underlying material. That is, proportionally more oxide is grown in areas of relatively thicker underlying material and less oxide is grown in areas of relatively thinner underlying material. Subsequent removal of the oxide leaves behind a relatively planarized surface of the underlying material, as compared to the pre-oxidized surface.

As used herein, the term "substrate" refers to some base work-piece on which additional material may be formed (e.g., grown or deposited) or which may itself be made a part of another base work-piece or stack of materials (e.g., another substrate or wafer by a cleaving process, for example). The term "wafer" is used herein to include a substrate as well as a multi-layered work-piece comprising a substrate with one or more films formed thereon, or two or more substrates joined together (e.g., by cleaving). A "wafer material" refers to (i) the base substrate (e.g., silicon); (ii) some material formed on a substrate; (iii) or some material in a composite stack of materials, having as their base a substrate.

By way of example only, aspects of the invention are described with reference to SOI wafers and Epi wafers. However, it is understood that the invention is not limited to particular wafer types. The following briefly describes how the fabrication processes of SOI and Epi wafers can produce uniform silicon surfaces requiring planarization according to techniques of the invention.

SOI Wafers

SOI wafers are enhanced wafers for complementary-metal-oxide-silicon (CMOS) device fabrication, combining both the benefits of an insulating layer (silicon oxide) with those of a silicon (Si) device layer. Insulating substrates is beneficial to reduce parasitic junction capacitance and prevent latchup and as well as enhance radiation hardness. An SOI microchip processing speed is approximately 30% faster than today's CMOS based chips and power consumption is reduced to 80%. Accordingly, future integrated silicon chips, or system-on-chip, will use SOI substrates where CMOS, bipolar heterostructure bipolar Transistor (HBT), quantum devices, optical waveguides, optical modulators, optical emitters and detectors are all integrated on a single chip.

Figure 19:
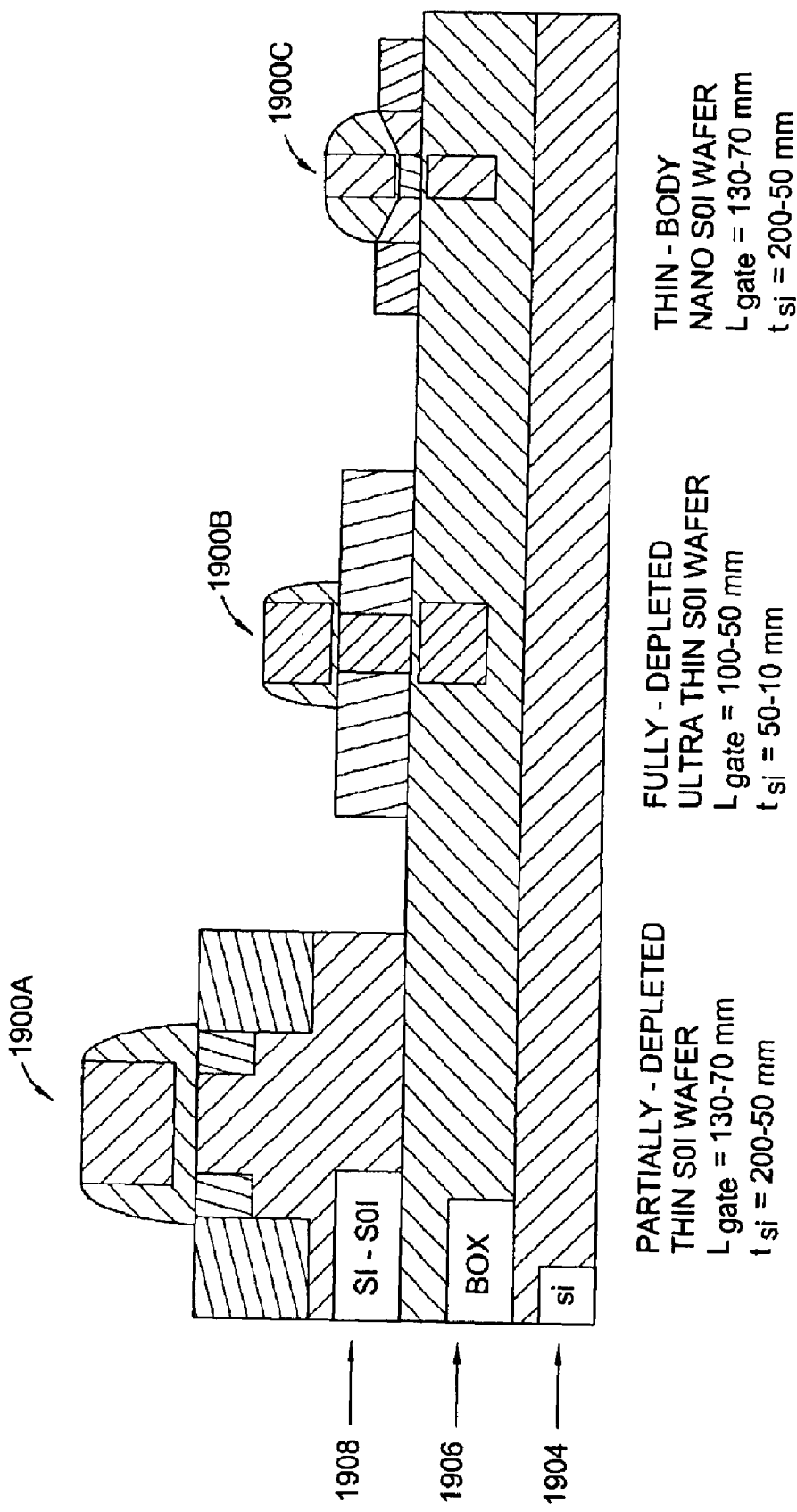
FIG. 19 shows illustrative transistors fabricated using SOI wafers.
Figure 20:
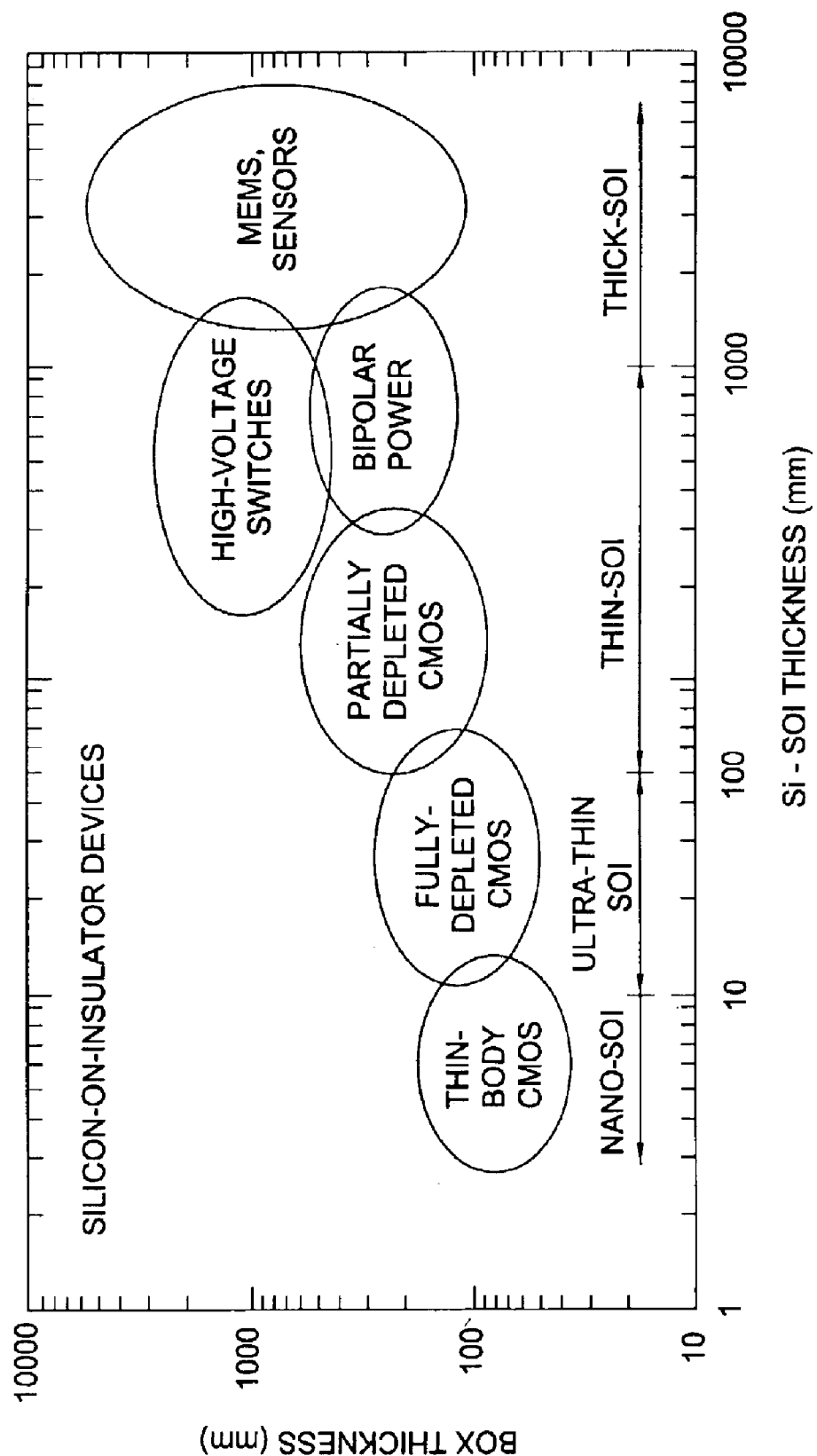
FIG. 20 shows applications for SOI wafers.

By way of illustration, FIG. 19 shows three representative SOI-based CMOS transistors 1900A–C. Specifically, FIG. 19 shows a silicon substrate 1904 having a buried oxide layer 1906 disposed thereon, and an active silicon layer 1908 formed on the buried oxide 1906. The three transistors 1900A–C are representative of partially depleted, fully depleted and thin body constructions, respectively. FIG. 20 shows applications for SOI-based applications characterized by the Si-SOI thickness and the box thickness.

A current method used to manufacture SOI wafers involves implanting hydrogen at a shallow depth below the surface of a bare silicon wafer. That wafer is then bonded onto a second wafer which has an insulator film (e.g., silicon dioxide, sapphire, silicon nitride, or even an insulating form of silicon itself) grown on its surface. After the bonding is complete, the stack is cleaved at the hydrogen implant depth leaving a wafer that has a film of single crystal silicon on top of an insulator film.

The cleaving process has the undesirable side effect of leaving a very rough surface upon which the devices are to be manufactured. For fully depleted and thin-body SOI wafers, top silicon thickness will be in the range of, for example, 50 nm–5 nm and the surface must be smooth in order to achieve the advantage of SOI. Accordingly, the inventive methods and apparatus provided techniques well-suited for planarizing SOI wafers.

The use of Epi technologies in SOI manufacturing has been shown to add flexibility and increased wafer quality, e.g., fewer defects and better top Si-layer uniformity, as well as cluster tool compatibility. Accordingly, some aspects of epi wafers are now described.

Epi Wafers

As used herein "epi wafers" refers to any wafers having a layer of epitaxial silicon formed thereon. The epitaxial silicon may be formed on, for example, monocrystalline silicon, silicon germanium and an SOI wafer. In a particular embodiment the epitaxial silicon layer is formed on a silicon germanium substrate to form strained silicon. In some embodiments, the epitaxial silicon is doped, such as with boron. However, it is contemplated that undoped epitaxial silicon may also be used. Preferably, formation of an epitaxial layer and formation of an oxide according to aspects of the invention is carried out in a cluster tool environment. By way of example, formation of an epitaxial layer may be carried out in atmospheric epi deposition chambers and reduced pressure epi deposition chambers, both of which are available from Applied Materials, Inc.

It is further contemplated that the epi wafers may first be cleaned, prior to deposition of epitaxial silicon. Accordingly, a cluster tool may be configured with cleaning chambers, as well as deposition chambers. One such chamber is the EpiClean chamber available from Applied Materials, Inc. The EpiClean chamber performs a pre-deposition clean process, removing native oxide layers and other contaminants at temperatures below 780° C. The cleaning process eliminates the need for a high-temperature bake or stabilization step in the deposition chamber, greatly reducing deposition chamber process time for increased throughput and lower operating cost. Preferably, the cleaning chamber and the epi deposition chambers are part of the same cluster tool such as can be found in the Epi Centura system available from Applied Materials, Inc.

Oxide Growth Apparatus and Processes

FIG. 1 shows one embodiment of an integrated manufacturing and planarization process 100. At step 102, a base material is formed. The base material may be in the form of a substrate or a film formed on a substrate (e.g., an epi layer or the top silicon layer of an SOI wafer). "Base material" as used herein refers to the material to be planarized. By way of illustration, embodiments of the invention will be described with reference to a silicon base material. The planarization process is initiated by growing an oxide on the base silicon, at step 104. The oxide is formed by consuming a portion of the base silicon material. As a result, the oxide may be silicon dioxide, for example. The oxide is then removed at step 106. Preferably, the oxide is removed using an etch process which allows the underlying material to act as an etch stop.

It should be understood that the above-described process 100 is merely illustrative, and that any number of additional steps may be performed. For example, the dotted lines of FIG. 1 illustrate other processing sequences that may be employed. In particular, it is contemplated that the topography of the base silicon may be determined (step 108) prior to formation of the oxide at step 104. Steps 108 and 104 may be performed in the same chamber or in different chambers. In one embodiment, the topography (i.e., a wafer map) is determined using an ellipsometer such as the Optiprobe Ellipsometer/Reflectometer tool from ThermaWave. In many cases, a profile of the base silicon is radially symmetrical, such that the topography is the same at any azimuth angle at a given radius. Thus, a cross section taken though the wafer center at any angle, exhibits substantially the same profile. (See, for example, the profile of the wafer before an oxide growth process in FIG. 11.) In other cases, the topography does not exhibit radial symmetry. In either case, the determination made at step 108 may provide input data for the system carrying out the formation of the oxide, thereby allowing the system to adjust the appropriate process parameters according to each unique topography of the base silicon. However, it is noted that where the base silicon being processed at step 104 has a consistent topography from one wafer to the next, it may be unnecessary to determine the profile of the base silicon for each wafer at step 108.

In another embodiment, conventional polishing is performed at step 110. Conventional polishing includes, for example, chemical mechanical polishing and dry polishing. Conventional polishing may be performed prior to or subsequent to determining the profile of the base silicon at step 108, or where step 108 is bypassed, prior to growing the oxide at step 104. In a particular embodiment, it is contemplated that the profile of the base silicon may be determined (step 108) both prior to the conventional polishing (step 110) and following the conventional polishing.

Still other steps which may be performed include, for example, cleaning steps and anneal steps. For example, in the case of epi deposition, native oxides may first be removed prior to deposition. Further, it is contemplated that a surface passivation step may be performed following the oxide removal (step 108). For example, a wafer may be annealed in any variety of inert or reactive gases (e.g., hydrogen) to remove dangling bonds and minimize damage to the surface. In addition, rinsing and drying steps may be used following oxide removal (step 108).

Further, any of the foregoing steps may be repeated any number of times. For example, following a polishing step (step 110), an oxide layer may be formed (step 104) and removed 104 and then the wafer may be polished again. Additionally or alternatively, the oxide formation step (104) may be repeated successively without an intermediary step. Additionally or alternatively, multiple cycles of oxidation (step 104) and subsequent removal (step 108) may be performed to achieve a desired degree of planarity, smoothness or other surface characteristics. Further, a given step represented by the process 100 may be representative of a variety of techniques. For example, the oxidation (step 104) may be performed according to a wet oxidation approach, in which parameters including flow, pressure, concentration and/or temperature may be the primary process parameter to be controlled; or a dry thermal oxidation approach, in which temperature is the primary process parameter to be controlled. With regard to step 104, in particular, it is contemplated that oxidation of a given wafer may include a succession of different techniques. A combination of oxidation growth techniques may produce superior results over any of the individual techniques alone. For example, the wet oxidation process disclosed herein may be used in combination with a dry oxidation process, where oxide growth is thermally controlled in an oxygenated environment. Illustrative dry oxidation processes may be referred to herein a dry rapid thermal oxidation (RTO). Illustrative wet oxidation processes described herein are referred to as an in situ steam generation process (ISSG) and an external (or ex situ) steam generation process. ISSG is generally described in U.S. Pat. No. 6,037,273, herein incorporated by reference in its entirety. However, aspects of the present invention differ significantly from existing ISSG techniques, in that such existing techniques are directed to formation of an oxide layer which becomes a part of the devices formed on a wafer. As such, the uniformity at the interface of the oxide and underlying material, and the subsequent removal of the oxide, have heretofore not been appreciated.

The process 100 includes steps which may be performed in separate chambers or in the same chamber. In one embodiment, conventional polishing is performed in a REFLEXION™ platform, while the profile determination, oxide formation and oxide removal are performed in a cluster tool. In a particular embodiment, the oxide formation is performed in the Radiance Centura® 300 mm tool, Radiance and XE Centura 200 mm tools or the Vantage 300 mm tool. In a particular embodiment, the profile determination and the oxide formation are performed in the same chamber. The REFLEXION™ platform, the Radiance Centura® 300 mm, Radiance and XE Centura 200 mm tools and the Vantage 300 mm tool are available from Applied Materials Inc.

As noted, aspects of the invention may be carried out in a cluster tool. Generally, a cluster tool is a modular system comprising multiple chambers which perform various functions including substrate center-finding and orientation, degassing, annealing, deposition and/or etching. According to an embodiment of the present invention, a cluster tool includes an oxidation chamber configured to perform the inventive oxide growth processes. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura®) and the Endura®, both available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. However, the exact arrangement and combination of chambers may be altered for purposes of performing specific steps of a fabrication process, which includes the present oxide growth process.

Figure 18:
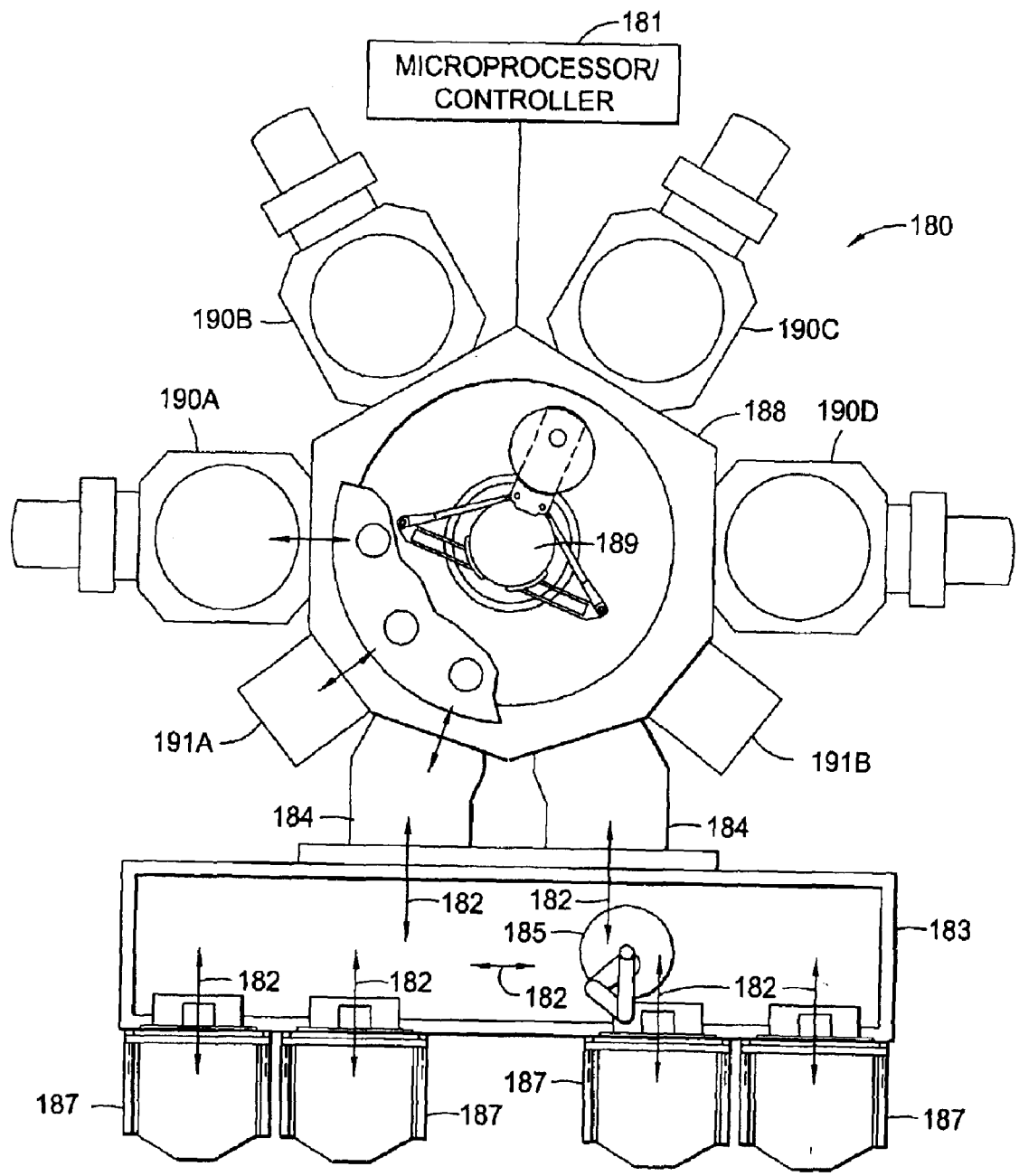
FIG. 18 shows a plan view of an exemplary cluster tool of the invention.

By way of illustration, one embodiment of a particular cluster tool 180 is shown in a plan view in FIG. 18. The cluster tool 180 generally comprises a plurality of chambers and robots and is preferably equipped with a microprocessor controller 181 programmed to carry out the various processing methods performed in the cluster tool 180. A front-end environment 183 is shown positioned in selective communication with a pair of load lock chambers 184. A pod loader 185 disposed in the front-end environment 183 is capable of linear and rotational movement (arrows 182) to shuttle cassettes of substrates between the load locks 184 and a plurality of pods 187 which are mounted on the front-end environment 183. The load locks 184 provide a first vacuum interface between the front-end environment 183 and a transfer chamber 188. Two load locks 184 are provided to increase throughput by alternatively communicating with the transfer chamber 188 and the front-end environment 183. Thus, while one load lock 184 communicates with the transfer chamber 188, a second load lock 184 communicates with the front-end environment 183. A robot 189 is centrally disposed in the transfer chamber 188 to transfer substrates from the load locks 184 to one of the various processing chambers 190 and service chambers 191. The processing chambers 190 may perform any number of processes such as physical vapor deposition, chemical vapor deposition, and etching while the service chambers 191 are adapted for degassing, orientation, cooldown and the like.

In a particular embodiment, at least one of the processing chambers 190A is configured as an oxide growth chamber. The oxide growth chamber 190A may be adapted to carry out dry oxidation processes, wet oxidation processes or combinations thereof. In one embodiment, two or more oxidation processes are performed in separate process chambers 190.

Another one of the processing chambers 190B may be an etch chamber adapted to remove the oxide from a substrate having been oxidized in the oxide growth chamber 190A. Accordingly, following the oxide growth process in the oxide growth chamber 190A, the substrate may be removed from the oxide growth chamber 190A and transported to the etch chamber 190B by the robot 189. The etch chamber 190B may be configured to perform any variety of etch processes. For example, the etch chamber 190B may be adapted to perform an HF dip and rinse. In another embodiment, the etch chamber 190B is a plasma etch chamber such as the Dielectric Etch eMax System, available from Applied Materials, Inc. Persons skilled in the art will recognize that the invention is not limited to a particular apparatus and technique for removal of the oxide.

In another embodiment, one of the chambers 190 or 191 is an inspection chamber in which the topography of substrates may be measured. For example, an inspection chamber 191A may include an ellipsometer. Substrates may be placed in the inspection chamber 191A, optically inspected to generate a wafer map and then transferred to the oxide growth chamber 190A. The wafer map may be used as input to processing equipment configured to calculated a target/desired oxide profile. The target/desired oxide profile is used to set the setpoints of the various parameter values for the oxide growth process performed in the oxide growth chamber 190A. Subsequently, the substrate may be transferred, via the robot 189, to the etch chamber 190B.

As previously noted, two particular applications of the invention include growing oxide on Epi substrates and SOI substrates. It is contemplated that the cluster tool 180 may be adapted to perform oxide growth processes on both or either Epi substrates and SOI substrates. Accordingly, in one embodiment, one or more of the processing chambers 190 may an Epi chamber adapted for the formation of an epitaxial silicon layer. The epi layer may be formed on, for example, silicon germanium or an SOI wafer. Following formation of the epi layer, the oxide growth process(es) of the present invention may be performed, after which the oxide may be removed by an etch step. If necessary, the epi layer may first be inspected in a metrology unit of the cluster too 180 to determine its profile. Further, where the epi layer is formed on another silicon layer, such as that of an SOI wafer, it is contemplated that the underlying silicon layer may itself be subjected to planarization by oxidation according to aspects of the invention prior to formation of the epi layer.

It is also contemplated that the growth of the uppermost silicon layer may be controlled to achieve a topography capable of being optimally planarized by the oxide growth processes of the invention. Thus, for example, an epi layer may be formed according to known characteristics of the oxide growth process so that the oxide growth is optimized. By way of illustration, assume that it is known that a particularly desirable oxide growth process consistently planarizes relatively more of a central region of a wafer relative to a peripheral region of the wafer. In this case, the epi layer may be purposefully formed to be relatively center-thick, thereby ensuring a greater degree of planarity following the oxide growth and subsequent removal. As such, it is contemplated that wafers may be inspected after a silicon layer (e.g., epi) is formed, and prior to the growth of oxide, to ensure that the silicon topography is appropriately matched with the oxide growth process to be performed. Therefore, it should be understood that the topography of the silicon layer to be planarized can be controlled both during the formation of the silicon layer and during the oxide growth process(es). A cluster tool provides an excellent environment for performing each of the steps as part of a comprehensive process. In this way, a higher degree of process-to-process control is achieved.

In addition, steps may be performed on SOI and epi wafer (as well as any other wafers) which are not typically performed in a cluster tool, such as the one shown in FIG. 18. For example, it is contemplated that wafers may be polished by conventional means (e.g., CMP) in a separate stand-alone platform prior to planarization by the oxide growth and removal processes of the present invention. Conventional polishing may serve to achieve a first degree of planarization, while the oxide growth/removal achieves a second degree of planarization. In the case of SOI wafers, for example, the SOI wafer may be polished by conventional methods to achieve a first degree of planarity following cleaving. Subsequently, the SOI wafer may be inspected in a metrology station to determine the profile. The SOI wafer can then be processed according to the invention to achieve additional planarization without the shortcomings of conventional polishing techniques. Similarly, in the case of epi wafers, a first degree of planarity by conventional methods may be achieved following deposition of the epitaxial layer. The wafer may then be subjected to the oxide growth processes of the present invention for additional planarization.

As noted above, one embodiment of the present invention includes steam generation processes (in situ and ex situ) for the growth of oxidation. According to the present invention, the in situ steam generation (ISSG) process includes the formation of steam ($H_2O$) in the same chamber which the substrate to be oxidized is located (i.e., steam is formed in situ with the substrate). A reactant gas mixture comprising a hydrogen-containing gas, such as but not limited to $H_2$ and $NH_3$ and an oxygen-containing gas, such as but not limited to $O_2$ and $N_2O$, is fed into a reaction chamber in which a substrate is located. The oxygen-containing gas and the hydrogen-containing gas are caused to react to form moisture or steam ($H_2O$) in the reaction chamber. The reaction of the hydrogen-containing gas and the oxygen-containing gas is ignited or catalyzed by heating the wafer to a temperature sufficient to cause the steam reaction. Because the heated wafer is used as the ignition source for the reaction, the steam generation reaction occurs in close proximity to the wafer surface. An apparatus suitable for in situ steam generation is described below with reference to FIGS. 2 and 3.

In the case of external (ex situ) steam generation, the steam is formed outside of the reaction chamber. That, the wafer does not operate as an ignition source for the reaction. Rather, an external thermal device is provided for generating the stream, which is then delivered into the reaction chamber containing the wafer to be processed. An apparatus suitable for ex situ steam generation is described below with reference to FIG. 17.

It should be noted that in each wet oxidation process (in situ and ex situ) steam is present and reacts with and oxidizes a wafer surface. However, the particular mechanism(s) by which steam generation and oxidation occurs is not limiting of the invention. For example, it is believed that part of the wet oxidation involves the formation of oxygen radicals, which may contribute to the oxidation of silicon. However, whether or not oxygen radicals are present during the reaction is not limiting of the invention and it is contemplated that any variety of reactions, known and unknown, occur during steam generation and oxidation.

In yet another embodiment, oxide is grown according to a dry RTO process, where oxide growth is thermally controlled. In a dry RTO process, a wafer may be placed in a chamber and then exposed to an oxygen-containing environment by allowing oxygen to flow from an oxygen source. The oxide growth is promoted by heating the wafer to a sufficient temperature. Thermally energizing the wafer may be accomplished by the provision of a heating apparatus, such as a lamp assembly. An apparatus suitable for dry RTO is described below with reference to FIGS. 2 and 3.

Yet another embodiment achieves oxide growth by the provision of a remote plasma source. Atomic oxygen may be formed in the remote plasma source and then delivered into an oxide formation chamber containing a wafer.

Accordingly, the invention is not limited to a particular method or apparatus for the formation of oxide. However, regardless of the technique or apparatus used, the growth of the oxide is controlled according to a surface topography of the wafer. That is, oxide is grown on a material so that, upon removal of the oxide, the exposed material is more planar than prior to the oxidation. Depending on the particular technique various parameters may be controlled to achieve the desired oxide growth pattern. For example, in the case of steam generation parameters such as flow, concentration, pressure and the like are controlled to achieve a desired oxide profile. In the case of dry RTO the heating apparatus is controlled produce a thermal gradient over the radius of the substrate.

By way of illustration only, and without limitation, oxide growth will be described primarily with reference to steam generation techniques.

In one embodiment, aspects of the invention are carried out in a rapid thermal heating apparatus, such as but not limited to, the Applied Materials, Inc. RTP Centura with a Honeycomb Source. Another suitable rapid thermal heating apparatus and its method of operation is set forth in U.S. Pat. No. 5,155,336 assigned to the Assignee of the present application. Additionally, although the steam generation reaction of the present invention is preferably carried out in a rapid thermal heating apparatus, other types of thermal reactors may be utilized such as the Epi or Poly Centura single wafer "cold wall" reactor by Applied Materials used to form high temperature films (HTF) such as epitaxial silicon, polysilicon, oxides and nitrides.

Figure 2:
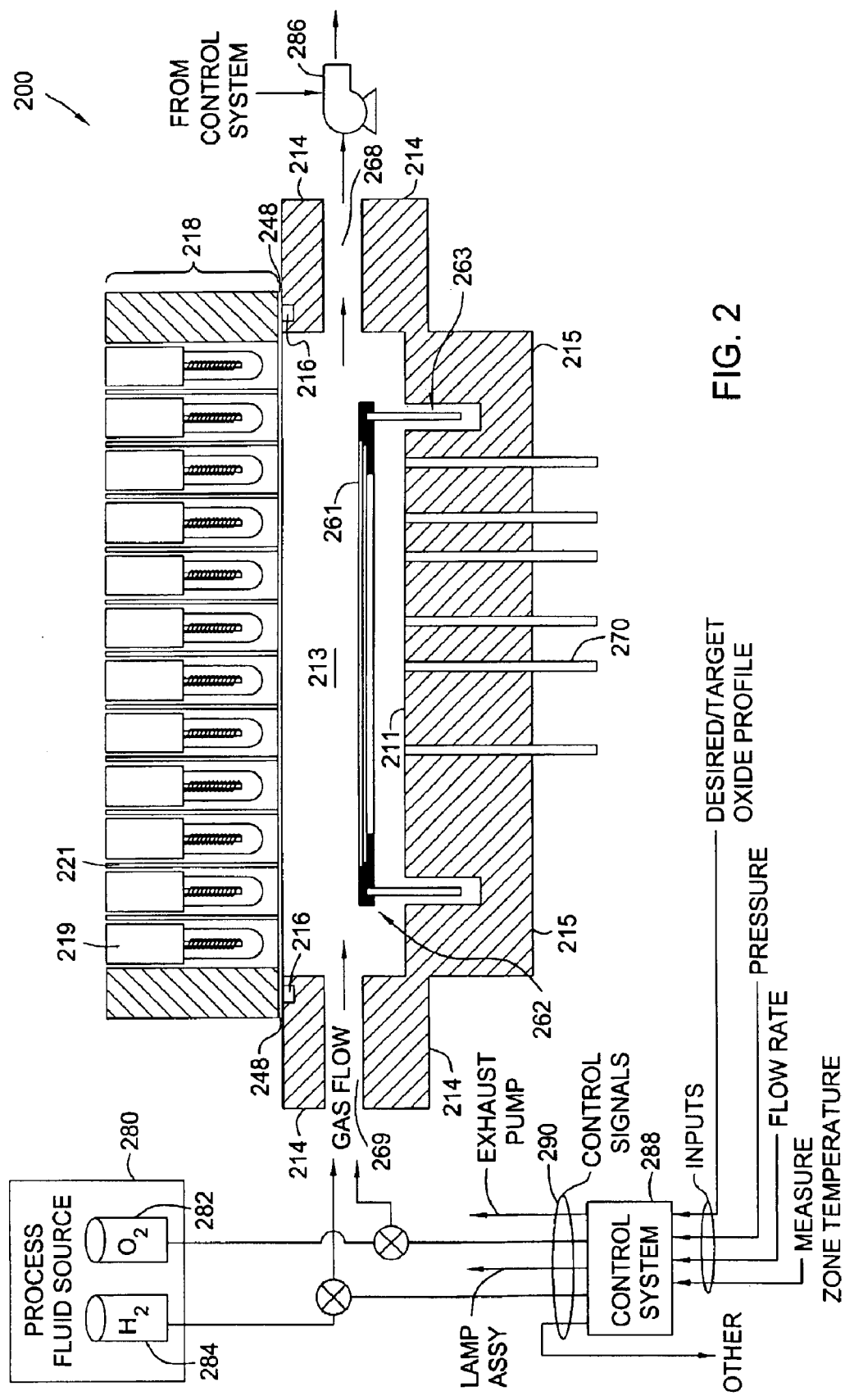
FIG. 2 is an illustration of a rapid thermal heating apparatus which can implement an oxidation process according to embodiments of the present invention.
Figure 3:
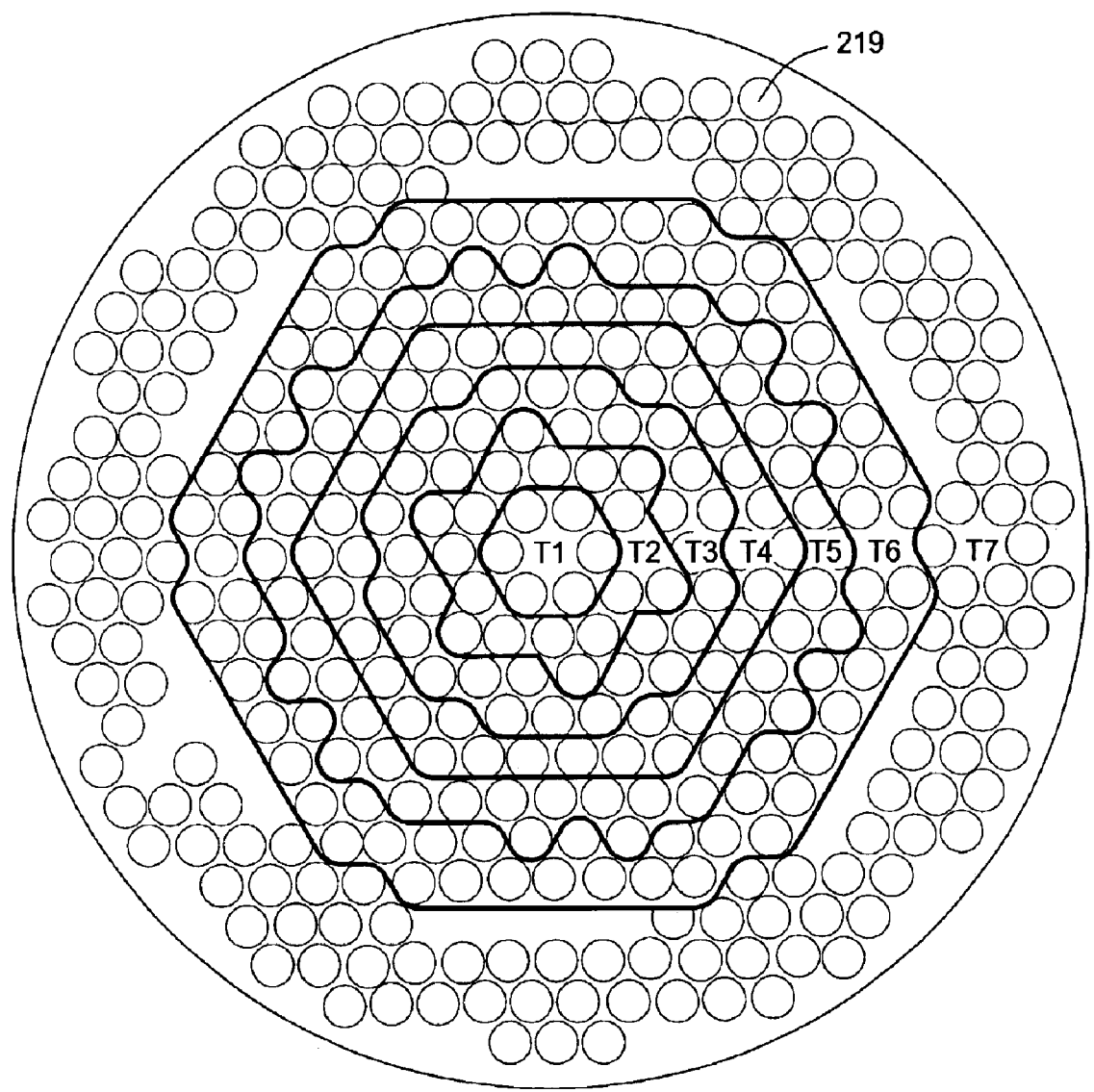
FIG. 3 is an illustration of the light source placement in the rapid thermal heating apparatus of FIG. 2.

FIGS. 2 and 3 illustrate a rapid thermal heating apparatus 200 which can be used to carry out the in situ steam oxidation and the dry RTO processes of the present invention. As noted above, the rapid thermal heating apparatus 200 may be part of a cluster tool capable of performing other processes. In one embodiment, the rapid thermal heating apparatus 200 is the Radiance chamber available from Applied Materials, Inc. Rapid thermal heating apparatus 200, as shown in FIG. 2, includes an evacuated process chamber 213 enclosed by a sidewall 214 and a bottom wall 215. The upper portion of sidewall 214 of chamber 213 is sealed to a window 248 by "O" rings 216.

A substrate or wafer 261 is supported on its edge inside chamber 213 by a support ring 262 typically made up of silicon carbide. Support ring 262 is mounted on a rotatable quartz cylinder 263. By rotating quartz cylinder 263 support ring 262 and wafer 261 can be caused to rotate. An additional silicon carbide adapter ring can be used to allow wafers of different diameters to be processed (e.g., 150 mm, 200 mm and 300 mm). The outside edge of support ring 262 preferably extends less than two inches from the outside diameter of wafer 261. The volume of chamber 213 is approximately nine liters for a 300 mm system.

Rapid thermal heating apparatus 200 includes a gas inlet 269 formed through sidewall 214 for injecting process gas into chamber 213 to allow various processing steps to be carried out in chamber 213. Coupled to gas inlet 269 is a fluid source 280 which includes sources of process fluids. For example, in one embodiment, the fluid source 280 includes a source 282 (e.g., a tank) of oxygen-containing gas such as $O_2$ and a source 284 (e.g., a tank) of hydrogen-containing gas such as $H_2$. Positioned on the opposite side of gas inlet 269, in sidewall 214, is a gas outlet 268. Gas outlet 268 is coupled to a vacuum source 286, such as a pump, to exhaust process gas from chamber 213 and to reduce the pressure in chamber 213. The vacuum source 286 maintains a desired pressure while process gas is continually fed into the chamber during processing.

A radiant energy assembly 218 is positioned over the window 248. The radiant energy assembly 218 includes a plurality of tungsten halogen lamps 219, for example Sylvania EYT lamps, each mounted into a light pipe 221 which can be a stainless steel, gold, brass, aluminum or other metal. Lamps 219 include a filament wound as a coil with its axis parallel to that of the lamp envelope. Most of the light is emitted perpendicular to the axis towards the wall of the surrounding light pipe 221. The light pipe length is selected to at least be as long as the associated lamp. The light pipe 221 may be longer provided that the power reaching the wafer is not substantially attenuated by increased reflection. The lamps 219 are positioned in a hexagonal array or in a "honeycomb shape" as illustrated in FIG. 3. Lamps 219 are positioned to adequately cover the entire surface area of wafer 261 and support ring 262. Lamps 219 (which may be on the order of hundreds) are grouped in zones which can be independently controlled to provide for extremely uniform or non-uniform heating of wafer 261, as is desired according to the process. In one embodiment, the lamps 219 are generally grouped into seven concentric zones Ti through 17, as shown in FIG. 3. The seven zones may be further subdivided into smaller groups in order to ensure a gradual thermal transition between the zones. The zones are symmetrically disposed. In this manner, temperature may be varied across the radius of a wafer. It is contemplated that the granularity and symmetry of thermal control may be more or less as desired for a particular process. Thus, in the present example, symmetrical thermally controllable zones of lamps are provided. Such an embodiment may be well-suited for wafers having symmetrical profiles and which may be rotated during processing to ensure symmetrical exposure to the heating elements. However, as noted above with respect to step 108 of FIG. 1, wafers may not exhibit symmetrical profiles. In such cases, a greater degree of thermal control may be desirable to achieve a desired oxide growth. Accordingly, it is contemplated that each of the lamps may be thermally controlled, or that the zones may selectable (i.e instead of predefined and symmetrical) to create any number of temperature maps, including asymmetrical ones. As such, the lamps are controlled according to the previously measured wafer map without limitation to symmetry or uniformity. (See step 108 of FIG. 1.) Aspects of a suitably radiant energy assembly 218 are further described in U.S. Pat. No. 6,350,964, which is hereby incorporated by reference in its entirety.

In this regard, it is contemplated that a wafer map may be generated for the entire upper surface of a silicon base. In this case, the wafer is not rotated during deposition so that greater selectivity of oxide formation may be achieved (e.g., by individually controllable thermal elements operated to heat the wafer).

The radiant energy source 218 comprising the plurality of light pipes 221 and associated lamps 219 allows the use of a thin quartz window 248 to provide an optical port for heating a substrate within the evacuative process chamber. A primary purpose of the window 248 is to isolate the process environment from the lamps 219 as the lamps 219 can get too hot and react with the process gases. Light pipes 221 can be cooled by flowing a coolant, such as water, between the various heat pipes.

The bottom wall 215 of apparatus 200 includes a top surface 211 for reflecting energy onto the backside of wafer 261. Additionally, rapid thermal heating apparatus 200 includes a plurality of optical temperature probes 270 positioned through the bottom wall 215 of apparatus 200 in order to detect the temperature of wafer 261 at a plurality of locations across its bottom surface. Reflections between the backside of the silicon wafer 261 and reflecting surface 211 create a blackbody cavity which makes temperature measurement independent of wafer backside emissivity and thereby provides accurate temperature measurement capability.

In one embodiment, the rapid thermal heating apparatus 200 is a single wafer reaction chamber capable of ramping the temperature of a wafer 261 or substrate at a rate of 5–250° C./sec. Rapid thermal heating apparatus 200 is referred to as a "cold wall" reaction chamber because the temperature of the wafer during the oxidation process is at least 400° C. greater than the temperature of chamber sidewalls 214. Heating/cooling fluid can be circulated through sidewalls 214 and/or bottom wall 215 to maintain walls at a desired temperature. For a steam oxidation process utilizing an in situ steam generation according to aspects of the present invention, chamber walls 214 and 215 are maintained at a temperature greater than room temperature (23° C.) in order to prevent condensation.

Aspects of the rapid thermal heating apparatus 200 are operated by a control system 288. The control system 288 may include any number of controllers, processors and input/output devices. In one embodiment, the control system is a component of a closed loop feedback system which monitors various parameters within the process chamber 213 while processing a wafer, and then issues one or more control signals 290 to make necessary adjustments according to various setpoints. In general, the parameters being monitored include the zone temperatures, chamber pressure and gas flow rates. Each of these parameters are adjusted and maintained during processing according to a predetermined desired/target oxide profile.

Figure 4:
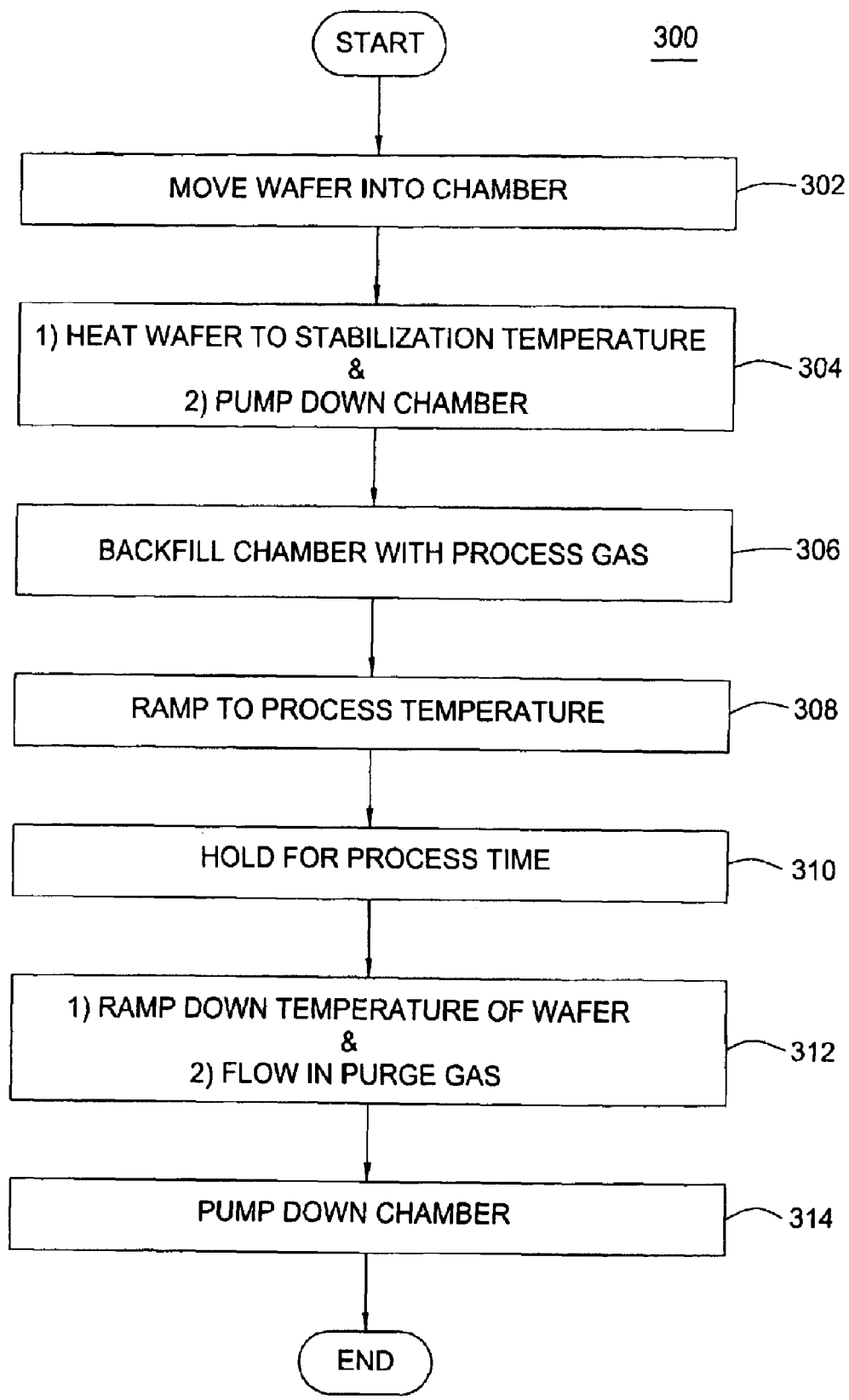
FIG. 4 is a flow chart which illustrates an oxidation process.
Figure 5A:
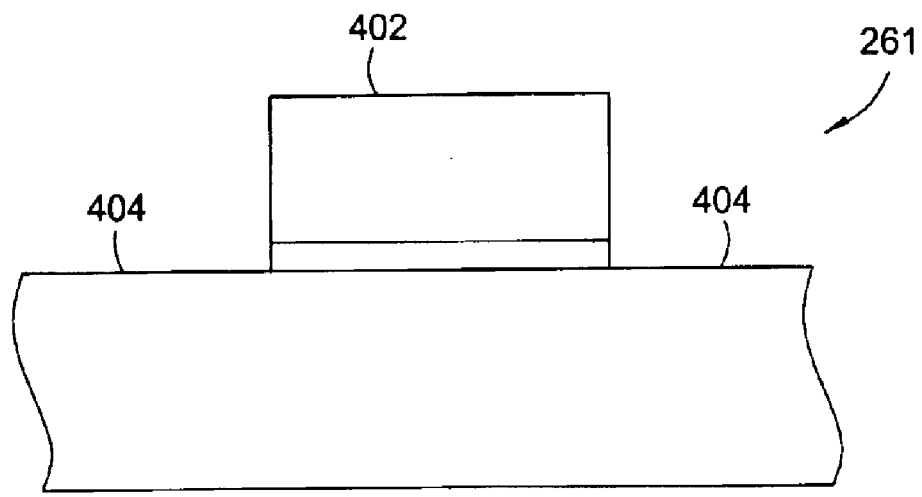
FIG. 5A is a cross sectional view of a semiconductor wafer or substrate prior to oxidation.

A method of processing a wafer according to aspects of the present invention is illustrated in a method 300 of FIG. 4. The method 300 is illustrative of one embodiment of step 104 of FIG. 1. As such, it is contemplated that a wafer map may have already been generated and the target profile determined (see step 108 of FIG. 1). The method 300 will be described with respect to an in situ steam generation process in the rapid thermal heating apparatus illustrated in FIGS. 2 and 3. Additionally, the oxidation process of the present invention will be described with respect to the steam oxidation of a silicon gate electrode 402 and a silicon substrate surface 404 of a silicon wafer 261 as shown in FIG. 5A. However, it is again emphasized that the in situ steam generation process is merely one embodiment for growing oxide, and other processes (e.g., ex situ steam generation, remote plasma, etc.) are contemplated. Further, it is to be appreciated that the oxidation processes of the present invention can be used to oxidize any form of silicon including epitaxial, amorphous, or polycrystalline, including doped (e.g., p-type or n-type) and undoped forms. Additionally, the processes can be used to oxidize other device or circuit features including but not limited to emitter and capacitor electrodes, interconnects and trenches, as well as be used to form gate dielectric layers. Accordingly, it is appreciated that the oxide growth processes of the invention may be adapted for the growth of an oxide which forms a part of a device.

The first step according to the present invention, as set forth in block 302, is to move a wafer or substrate, such as wafer 261, into vacuum chamber 213. As is typical with modern cluster tools, wafer 261 may be transferred by a robot arm from a load lock through a transfer chamber and placed face up onto silicon carbide support ring 262 located in chamber 213 as shown in FIG. 2. Wafer 261 will generally be transferred into vacuum chamber 213 having a nitrogen ($N_2$) ambient at a suitable transfer pressure (e.g., approximately 20 Torr). Chamber 213 is then sealed.

Next, in block 304, the pressure in chamber 213 is further reduced by evacuating the nitrogen ($N_2$) ambient through gas outlet 268. Chamber 213 is evacuated to a pressure to sufficiently remove the nitrogen ambient. Chamber 213 is pumped down to a preaction pressure less than the pressure at which the in situ steam generation is to occur, and is preferably pumped down to a pressure of less than 1 Torr.

Simultaneous with the prereaction pump down, power is applied to lamps 219 which in turn irradiate wafer 261 and silicon carbide support ring 262, thereby heating the wafer 261 and support ring 262 to a stabilization temperature. The stabilization temperature of wafer 261 is less than the temperature (reaction temperature) required to initiate the reaction of the hydrogen-containing gas and oxygen-containing gas to be utilized for the in situ steam generation. The stabilization temperature in one embodiment is approximately 500° C. The stabilization time may vary from several minutes to as short as 0 seconds. Thus, in one embodiment, a stabilization step is avoided altogether to achieve a higher throughput.

Once the stabilization temperature and the prereaction pressure are reached, chamber 213 is backfilled with the desired mixture of process gas. In one embodiment, the process gas includes two reactant gasses: a hydrogen-containing gas and an oxygen-containing gas, which can be reacted together to form water vapor ($H_2O$) at temperatures between 400–1250° C. The hydrogen-containing gas, is preferably hydrogen gas ($H_2$), but may be other hydrogen-containing gasses such as, but not limited to, ammonia ($NH_3$), deuterium (heavy hydrogen) and hydrocarbons such as methane ($CH_4$). The oxygen-containing gas is preferably oxygen gas ($O_2$) but may be other types of oxygen-containing gases such as but not limited to nitrous oxide ($N_2O$). Other gasses, such as but not limited to nitrogen ($N_2$), may be included in the process gas mix if desired. The oxygen-containing gas and the hydrogen-containing gas are preferably mixed together in chamber 213 to form the reactant gas mixture.

Figure 6:
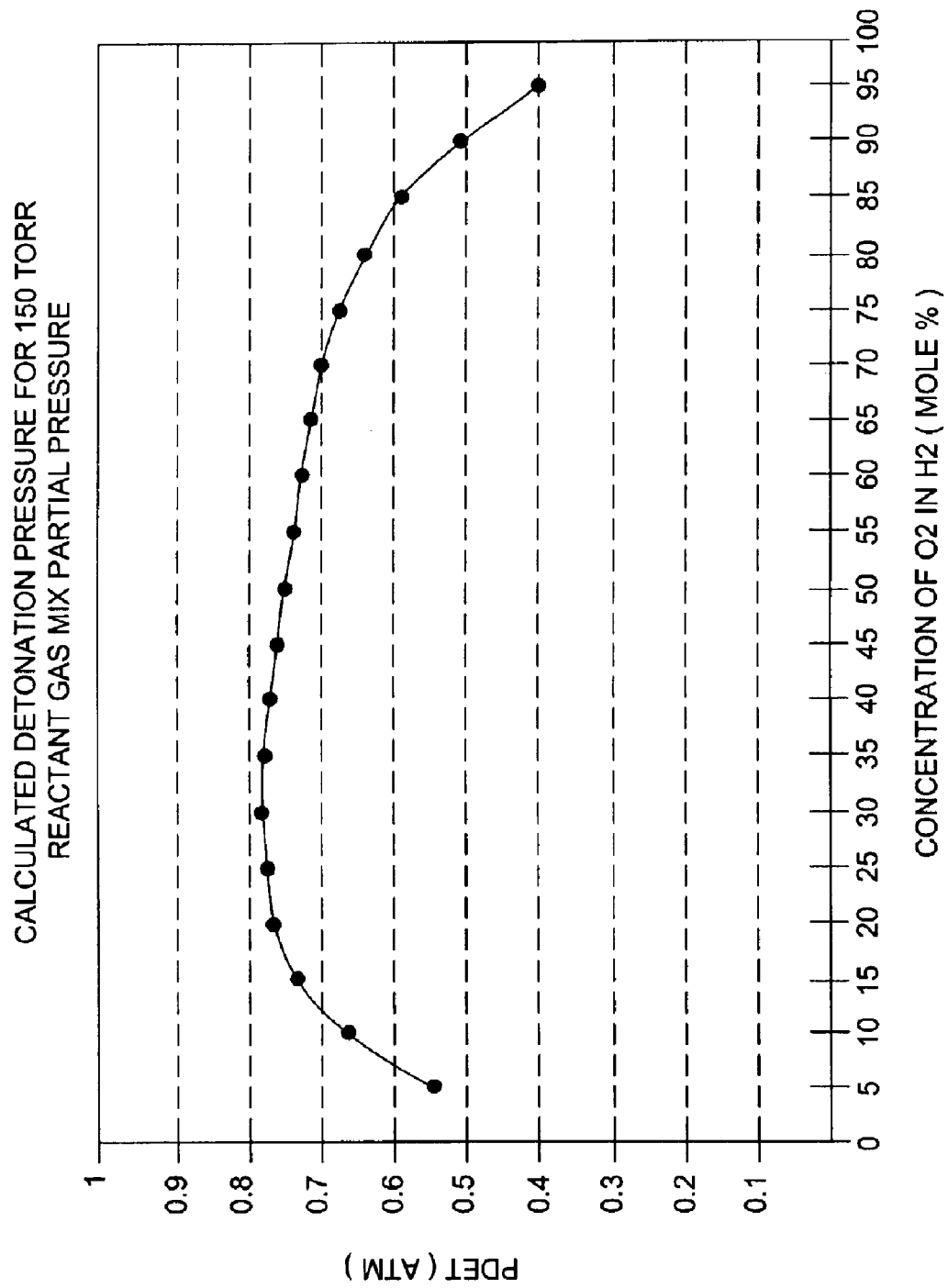
FIG. 6 is a graph which illustrates the detonation pressure created for various $O_2/H_2$ concentration ratios having a partial pressure of 150 Torr.

In the present invention the partial pressure of the reactant gas mixture (i.e., the combined partial pressure of the hydrogen containing gas and the oxygen containing gas) is controlled to ensure safe reaction conditions. According to the present invention, chamber 213 is backfilled with process gas such that the partial pressure of the reactant gas mixture is less than the partial pressure at which spontaneous combustion of the entire volume of the desired concentration ratio of reactant gas will not produce a detonation pressure wave of a predetermined amount. The predetermined amount is the amount of pressure that chamber 213 can reliably handle without failing. FIG. 6 is a graph which shows detonation pressures for different reactant gas mixtures of $O_2$ and $H_2$ at a partial pressure of 150 Torr for the spontaneous combustion of the entire volume, about 2 liters, of chamber 213 at a process temperature of 950° C. According to the present invention, in situ steam generation is preferably carried out in a reaction chamber that can reliably handle a detonation pressure wave of four atmospheres or more without affecting its integrity. In such a case, reactant gas concentrations and operating partial pressure preferably do not provide a detonation wave greater than two atmospheres for the spontaneous combustion of the entire volume of the chamber.

By controlling the chamber partial pressure of the reactant gas mixture in the present invention any concentration ratio of hydrogen containing gas and oxygen containing gas can be used including hydrogen rich mixtures utilizing $H_2/O_2$ ratios greater than 2:1, respectively, and oxygen rich mixtures using $H_2/O_2$ ratios less than 0.5:1, respectively. For example, FIG. 6 shows that any concentration ratio of $O_2$ and $H_2$ can be safely used as long as the chamber partial pressure of the reactant gasses is maintained at less than 150 Torrs at process temperature. The ability to use any concentration ratio of oxygen-containing gas and hydrogen-containing gas enables one to produce an ambient with any desired concentration ratio of $H_2/H_2O$ or any concentration ratio of $O_2/H_2O$ desired. Whether the ambient is oxygen rich or dilute steam or hydrogen rich or dilute steam can greatly affect device electrical characteristics. The present invention enables a wide variety of different steam ambients to be produced and therefore a wide variety of different oxidation processes to be implemented.

In some oxidation processes, an ambient having a low steam concentration with the balance being $O_2$ may be desired. Such an ambient can be formed by utilizing a reactant gas mixture comprising 10% $H_2$ and 90% $O_2$. In other processes, an ambient of hydrogen rich steam (70–80% $H_2$/30–20% $H_2O$) may be desired. A hydrogen rich, low steam concentration ambient can be produced by utilizing a reactive gas mix comprising between 5–20% $O_2$ with the remainder being $H_2$ (95–80%). It is to be appreciated that in the present invention any ratio of hydrogen-containing gas and oxygen-containing gas may be utilized because the heated wafer provides a continual ignition source to drive the reaction.

Next, as set forth in block 308, power to lamps 219 is increased so as to ramp up the temperature of wafer 261 to process temperature. Wafer 261 is preferably ramped from the stabilization temperature to process temperature at a rate of between 10–100° C./sec with 75° C./sec being typical. The preferred process temperature of the present invention is between 600–1150° C. with 1100° C. being typical. The process temperature must be at least the reaction temperature (i.e., must be at least the temperature at which the reaction between the oxygen-containing gas and the hydrogen-containing gas can be initiated by wafer 261), which is typically at least 600° C. It is to be noted that the actual reaction temperature depends upon the partial pressure of the reactant gas mixture as well as on the concentration ratio of the reactant gas mixture, and can be between 400° C. to 1250° C.

As the temperature of wafer 261 is ramped up to process temperature, it passes through the reaction temperature and causes the reaction of the hydrogen-containing gas and the oxygen-containing gas to form moisture or steam ($H_2O$). Since rapid thermal heating apparatus 200 is a "cold wall" reactor, the only sufficiently hot surfaces in chamber 213 to initiate the reaction is the wafer 261 and support ring 262. As such, in the present invention the steam generating reaction occurs near the surface of wafer 261.

Since it is the temperature of the wafer (and support ring) which initiates or turns "on" the steam generation reaction, the reaction is said to be thermally controlled by the temperature of wafer 261 (and support ring 262). Additionally, the vapor generation reaction of the present invention is said to be "surface catalyzed" because the heated surface of the wafer is necessary for the reaction to occur, but is not consumed in the reaction which forms the water vapor.

Figure 5B:
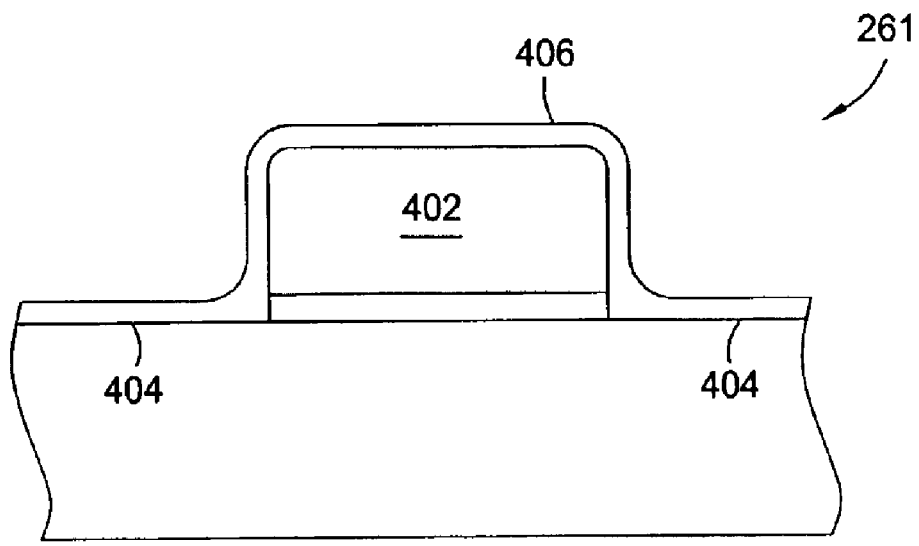
FIG. 5B is an illustration of a cross sectional view showing the formation of an oxide on the substrate of FIG. 5A by an oxidation process.

Next, as set forth in block 310, once the desired process temperature has been reached, the temperature of wafer 261 is maintained (held constant or varied) at or above the process temperature for a sufficient period of time to enable the water vapor generated from the reaction of the hydrogen-containing gas and the oxygen-containing gas to oxidize silicon surfaces or films to form $SiO_2$. Wafer 261 will typically be held at process temperature for between 10–240 seconds. Process time and temperature are generally dictated by, or at least dependent on, the thickness of the oxide film desired, the purpose of the oxidation, and the type and concentrations of the process gasses. FIG. 5B illustrates an oxide 406 formed on wafer 261 by oxidation of silicon surfaces 402 and 404 by water vapor ($H_2O$) generated by the in situ steam generation process. It is to be appreciated that the process temperature must be sufficient to enable the reaction of the generated water vapor or steam with silicon surfaces to form silicon dioxide.

Next, as set forth in block 312, power to lamps 219 is reduced or turned off to reduce the temperature of wafer 261. The temperature of wafer 261 decreases (ramps down) as fast as it is able to cool down (at about 50° C./sec). Simultaneously, $N_2$ purge gas is fed into the chamber 213. The steam generation reaction ceases when wafer 261 and support ring 262 drop below the reaction temperature. Again it is the wafer temperature (and support ring) which dictates when the steam reaction is turned "on" or "off".

Next, as set forth in block 314, chamber 213 is pumped down, preferably below 1 Torr, to ensure that no residual oxygen-containing gas and hydrogen-containing gas are present in chamber 213. The chamber is then backfilled with $N_2$ gas to the desired transfer pressure and wafer 261 transferred out of chamber 213 to complete the process. At this time a new wafer may be transferred into chamber 213 and the process 300 set forth FIG. 4 repeated. Alternatively, it may be desirable to repeat the process 300 for the same wafer with the same or different process parameter values.

The wafer is then transported to another location where the oxide is removed. In one embodiment, the wafer is placed in a HF dip. The HF dip may be between 1% HF/99% water to 50% HF/50% water. Typically, an HF dip is performed at room temperatures. Etch times vary widely depending on the HF concentration but times between 10 seconds (high HF concentration) and 800 seconds (1% HF concentration) are typical. An HF bath provides a cost efficient approach to selectively removing the oxide from the silicon underlayer of a wafer since the silicon acts as an etch stop. That is, the HF etching mechanism is substantially slowed or terminated upon removal of the oxide and exposure of the underlying silicon. Persons skilled in the art will recognize that the invention is not limited to a particular apparatus and technique for removal of the oxide. A variety of systems for removing the oxide are available from Applied Materials, Inc., for example. One system from Applied Materials, Inc. that may be used to advantage is the Dielectric Etch eMax System.

At times during the ISSG process it may be desirable to utilize concentration ratios of hydrogen-containing gas and oxygen-containing gas which will produce an ambient with a large concentration of water vapor (e.g., >40% $H_2O$). Such an ambient can be formed with a reactant gas mixture, for example, comprising 40–80% $H_2$/60–20% $O_2$. A gas mixture near the stoichiometric ratio may yield too much combustible material to ensure safe reaction conditions. In such a situation, a low concentration gas mixture (e.g., less than 15% $O_2$ in $H_2$) can be provided into the reaction chamber during step 306, the wafer temperature raised to the reaction temperature in step 308, and the reaction initiated with the lower concentration ratio. Once the reaction has been initiated and the existing reactant gas volume begins to deplete, the concentration ratio can be increased to the desired level. In this way, the amount of fuel available at the start of the reaction is kept small and safe operating conditions assured.

In some cases, a relatively low reactive gas partial pressure is used for in situ steam generation in order to obtain enhanced oxidation rates. It has been found that providing a partial pressure of between 1 Torr to 50 Torr of hydrogen gas ($H_2$) and oxygen gas ($O_2$) that an enhanced oxide growth rate of silicon can be achieved. That is, for a given set of process conditions (i.e., $H_2/O_2$ concentration ratio, temperature, and flow rate) the oxidation rate of silicon is actually higher for lower partial pressures (1–50 Torr) of $H_2$ and $O_2$ than for higher partial pressures (i.e., from 50 Torr to 100 Torr).

Figure 7:
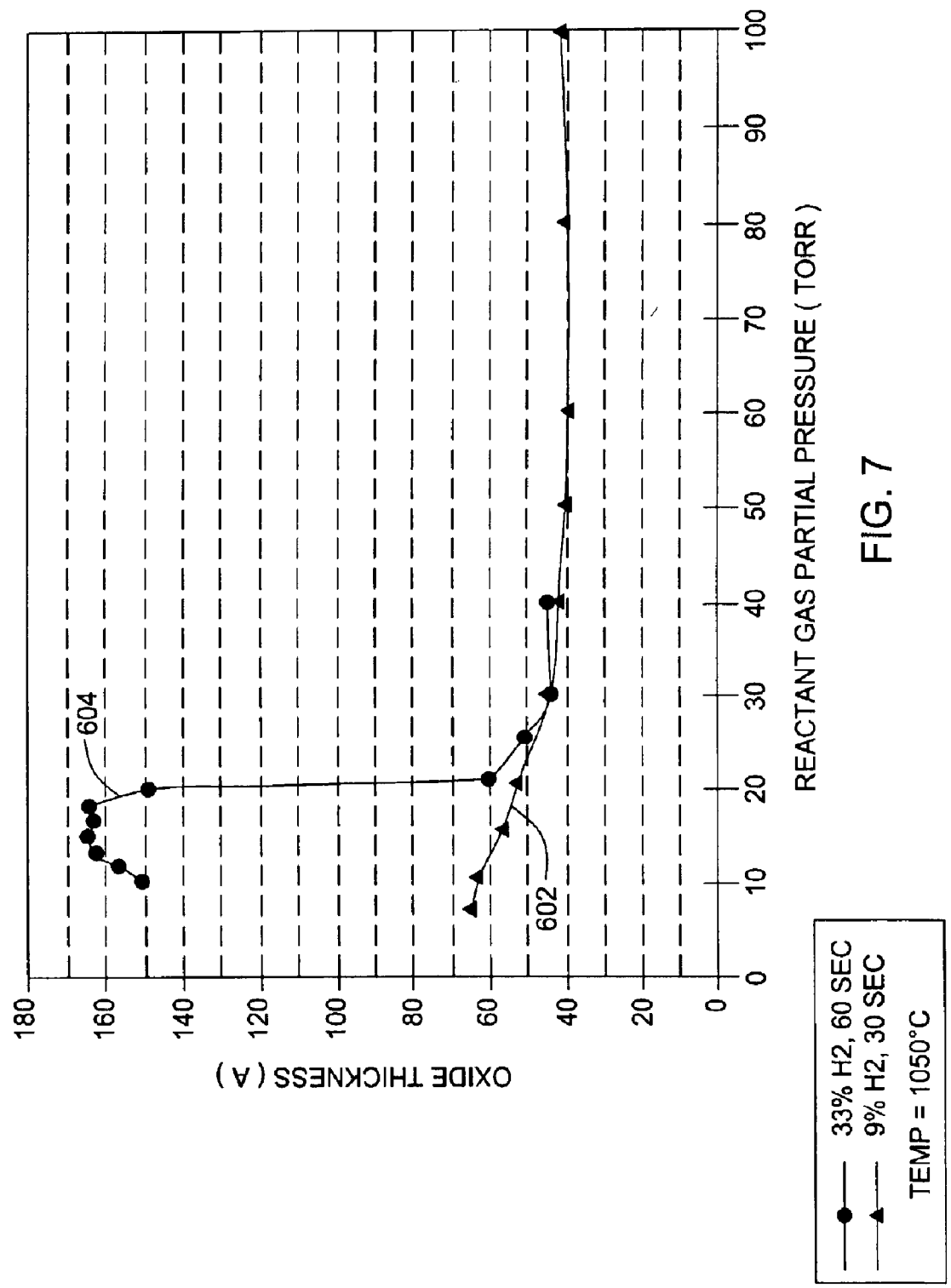
FIG. 7 illustrates plots which depict oxide thickness versus reactant gas partial pressure for different $H_2/O_2$ concentrations.

The plots of FIG. 7 illustrate how reactant gas partial pressures can enhance the oxidation rate of silicon. Plot 602 depicts different oxide thicknesses that are formed for different reactant gas partial pressures for an ambient created by reacting 9% $H_2$ with 91% $O_2$ at 1050° C. for 30 seconds. Plot 604 depicts different oxide thicknesses that are formed for different reactant gas partial pressures for an ambient created by reacting 33% $H_2$ with 66% $O_2$ at 1050 C for 60 seconds.

As is apparent from the graphs of FIG. 7, as the reactant gas partial pressure of $H_2$ and $O_2$ is incrementally decreased from atmospheric pressure to about 50 Torr for 9% $H_2$, and to about 30 Torr for 33% $H_2$, the oxidation rate of silicon also decreases incrementally. A decrease in oxidation rate for silicon with a decrease in reactant gas partial pressure is expected in that one would expect when less $O_2$ and $H_2$ are available for the generation of steam the oxidation rate would decrease. When a reactant gas partial pressure of less than or equal to approximately 50 Torr for 9% $H_2$ and 30 Torr for 33% $H_2$ obtained, however, the oxidation rate begins to increase with incremental decreases in reactant gas partial pressure. The oxidation rate continues to increase until a maximum enhanced oxidation rate is reached at approximately 8–12 Torr at which point the oxidation rate begins to decrease for incremental decreases in reactant gas partial pressure. Although the oxidation rate begins to decrease after the maximum enhanced oxidation rate achieved at 8–12 Torr, it still provides an enhanced oxidation rate (i.e., provides an oxidation rate greater than the oxidation rate generated at approximately 50 Torr (9% $H_2$) and 30 Torr (33% $H_2$)) until a reactant gas partial pressure of approximately 1–3 Torr at which point the oxidation rate enhancement falls off.

Figure 8:
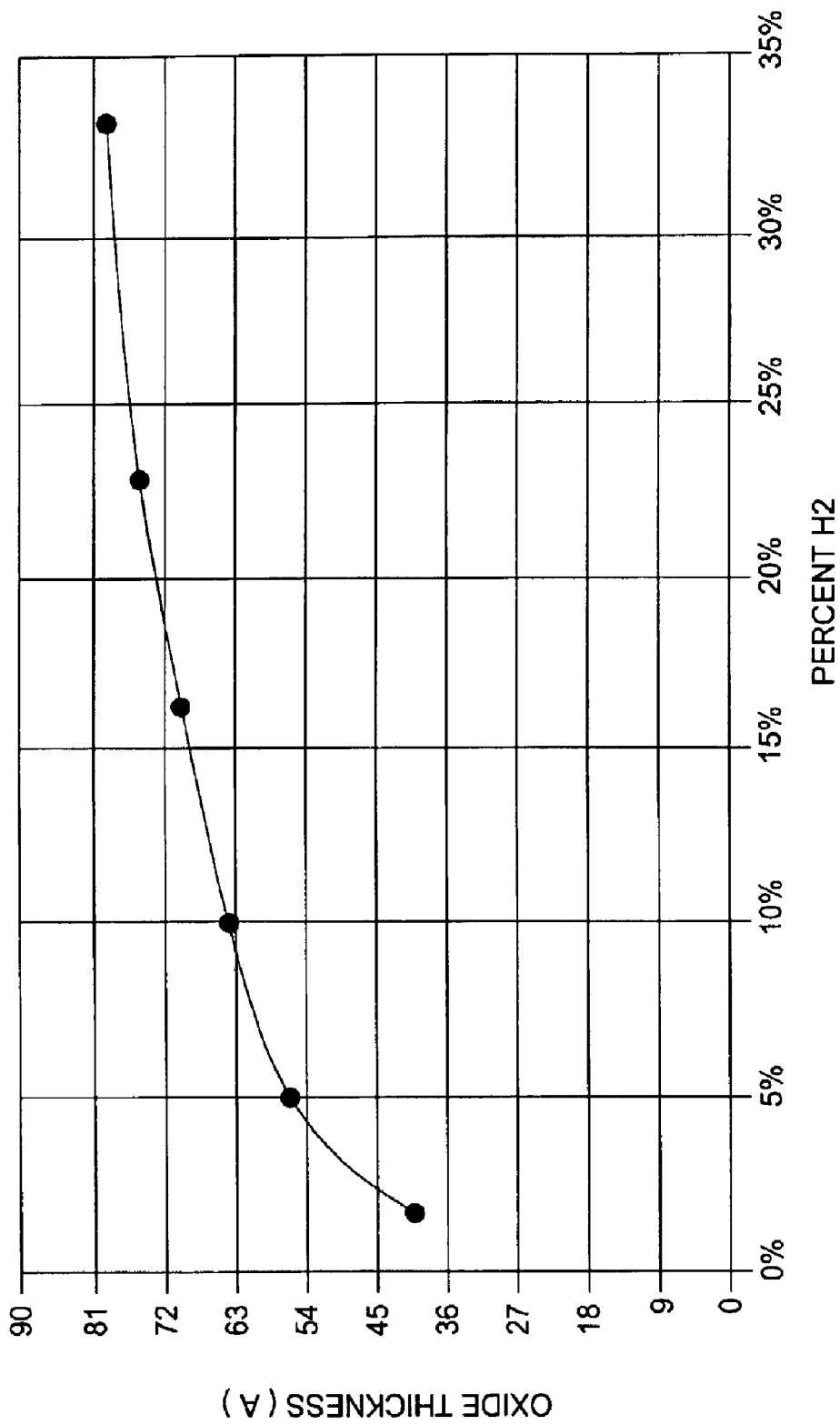
FIG. 8 is a plot which illustrates oxide thickness versus $H_2/O_2$ reactant gas concentration ratios.

Although the oxidation rate of only two concentration ratios of $H_2/O_2$ are illustrated in FIG. 7, the oxidation rate of other concentration ratios between 2% $H_2$/98% $O_2$ to 66% $H_2$/33% $O_2$ behave similarly. It has been found that when operating at reactant gas partial pressures where enhanced oxidation occurs (i.e., at or below the reactant gas partial pressure at which a decrease in the reactant gas partial pressure for a given set of process parameters causes an increase in the oxidation rate of silicon), that the oxidation rate of silicon is influenced by the concentration ratio of the hydrogen-containing gas and the oxygen-containing gas. For example, FIG. 8 illustrates different oxidation thicknesses for different concentration ratios of $H_2$ and $O_2$ for a given set of process parameters (i.e., $O_2$ flow 10 SLM, reactant gas partial pressure 10 Torr, temperature 1050° C., and time 30 seconds). As illustrated in FIG. 8, the greatest increase in oxidation rate occurs between 1–5% $H_2$ while after 33% $H_2$ the oxidation rate stabilizes at about 150 angstroms per minute.

Figure 9:
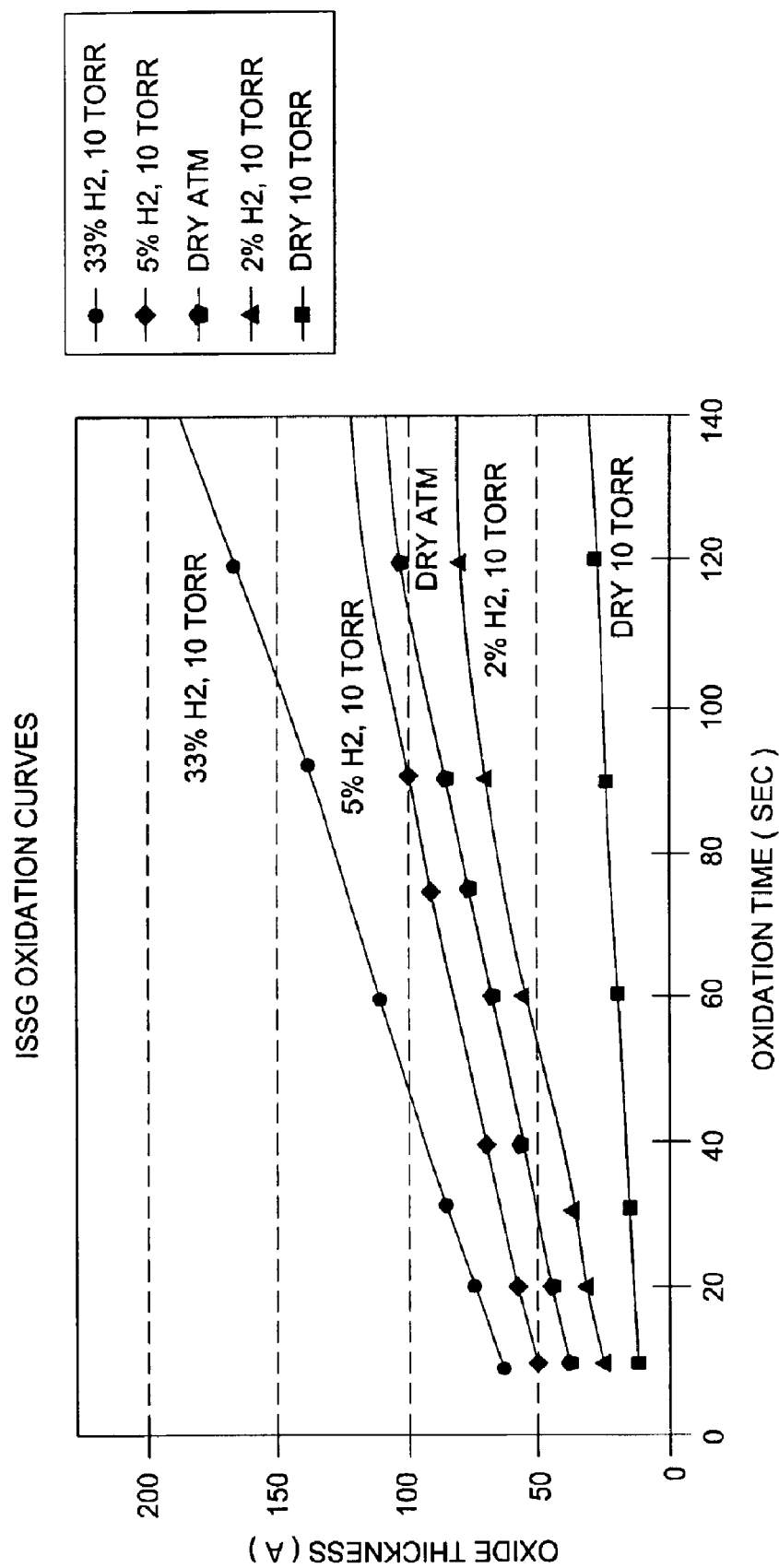
FIG. 9 illustrate plots which depict oxide thickness versus oxidation time for various concentration ratios and reactant gas partial pressures.

FIG. 9 illustrates how oxide thickness varies for oxidation time for different in situ steam oxidation processes (33% $H_2$/66% $O_2$; 5% $H_2$/95% $O_2$; 2% $H_2$/98% $O_2$, or at 10 Torr) and different dry oxidation processes (100% $O_2$ at 10 Torr and 100% $O_2$ at atmospheric). As illustrated in FIG. 9, reduced pressure steam oxidation processes provide for increased oxidation rates over dry oxidation processes at the same pressure. Additionally, in situ steam generated oxidation processes with a $H_2$ concentration greater than 3% provide higher oxidation rates than do dry oxidation processes at all oxidation pressures including atmospheric pressure.

Figure 10:
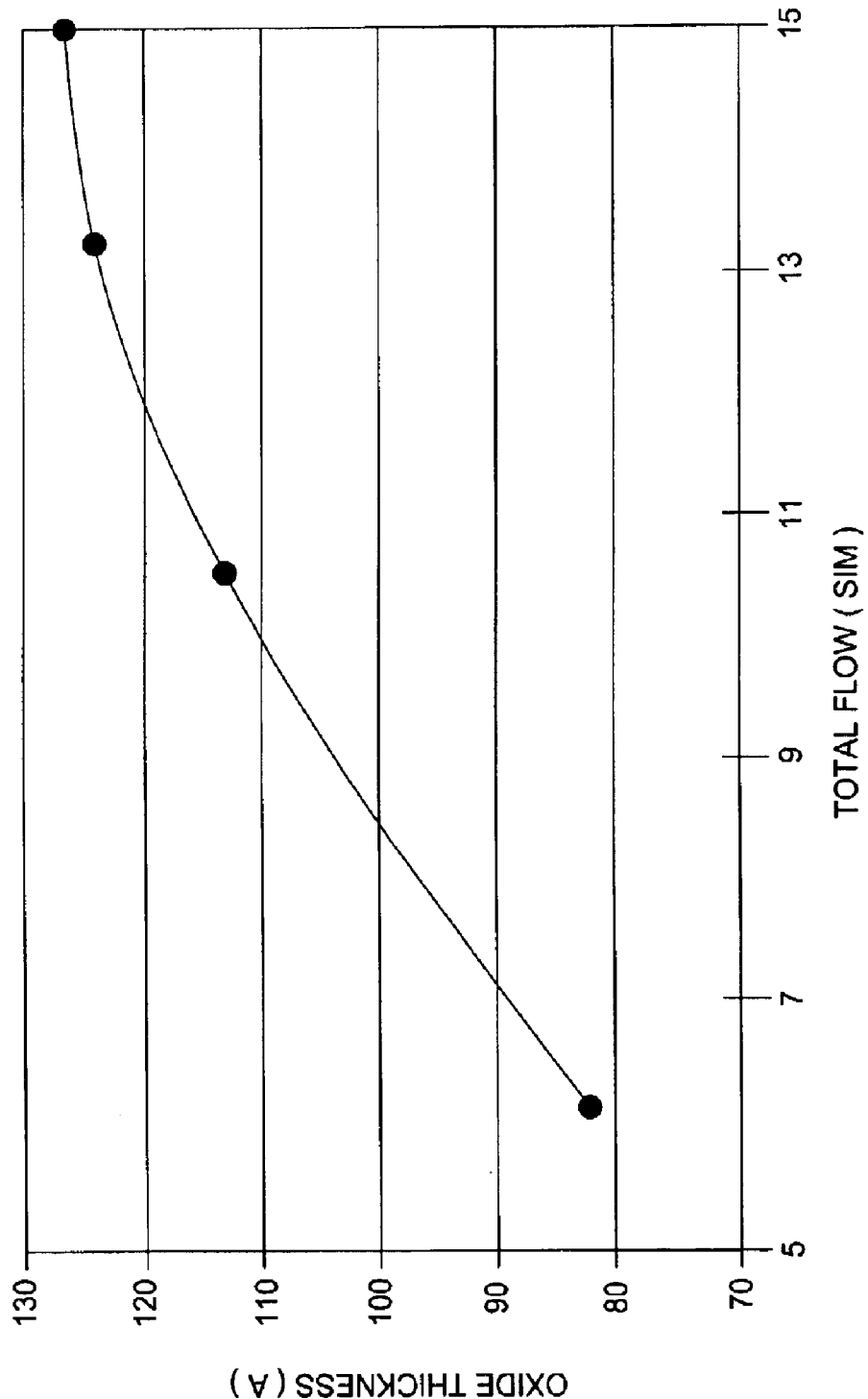
FIG. 10 is a plot which illustrates oxide thickness versus total flow of process gas.

When operating at oxidation pressures which obtain enhanced silicon oxidation rates, the oxidation rate is strongly influenced by the total flow rate of the oxygen containing gas and the hydrogen containing gas. For example, FIG. 10 illustrates how the oxidation rate of silicon varies for the total flow rate of a 33% $H_2$/66% $O_2$ reactant gas mix at a reactant gas partial pressure of 10 Torr and a temperature of 1050° C. in rapid thermal processing apparatus 200, having a chamber volume of approximately 2 liters. As shown in FIG. 10, when operating at low reactant gas partial pressures, in order to generate enhanced oxidation rates, an increase in the total flow increases the oxidation rate. As shown in FIG. 10 the oxidation rate increases dramatically for an increase in total flow when the total flow is less than 10 SLM and increases, but less dramatically, for increases in total flow above 10 SLM.

Accordingly, when operating at a partial pressure to provide enhanced oxidation, the oxidation rate of silicon can be said to be "mass transport rate" limited. That is, the oxidation rate is limited by the amount of reactant gas fed into the chamber.

In addition to the oxide rate, various parameters of the in situ steam generation process affect the thickness profile of the resulting oxide. In particular, it has been determined that pressure, flow rate, temperature and oxidation mixture concentration primarily dictate the oxide thickness profile. By controlling each of these parameters, a desired (or target) oxide profile can be achieved. A desired oxide profile is one which consumes a desired amount of silicon to produce a sufficiently planar silicon surface when the oxide is subsequently removed. A sufficiently planar silicon surface is defined according to the particular application. For example, in the case of some SOI wafers, the silicon layer must have a ROOT-MEAN-SQUARE (RMS) surface roughness of no more than 0.1 nm.

Figure 11:
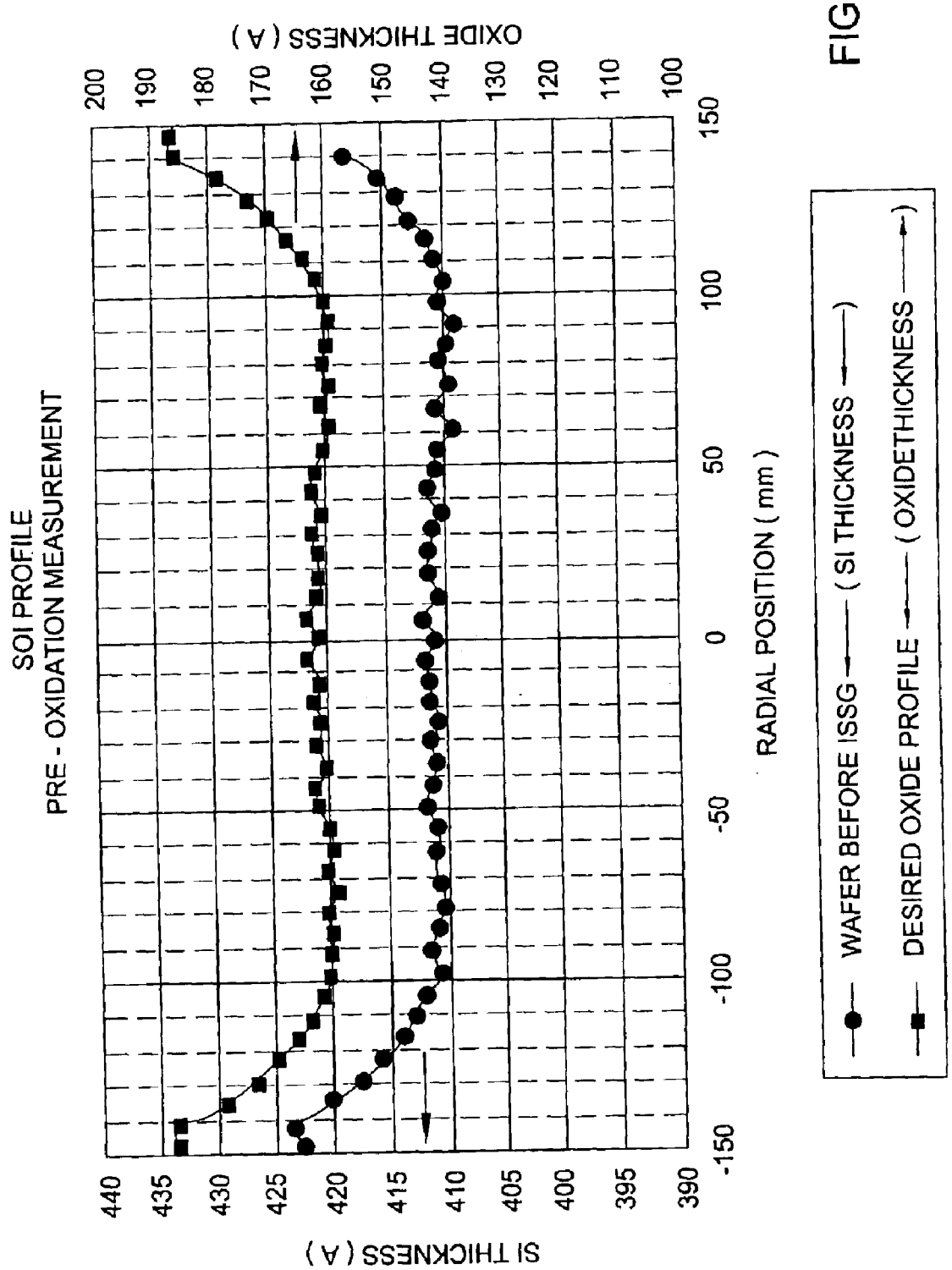
FIG. 11 is a plot illustrating a wafer profile before an in situ steam generation (ISSG) process versus a desired oxide profile.

By way of illustration, FIG. 11 shows a pre-oxidation wafer profile and a desired oxide profile. Oxide thickness in angstroms (on the y-axis) is shown with respect to a radial position (on the x-axis) on a wafer. Note how the desired oxide profile substantially conforms to the profile of the pre-oxidized substrate. Such a result is consistent with the objective of planarizing the underlying silicon since thicker oxide indicates more consumption of silicon. In one embodiment, the desired/target oxide thickness is calculated assuming a certain fractional consumption of silicon.

The fractional consumption of silicon when oxidizing is a well-known constant, about 43%. That is, about 0.43 Å of Si is consumed for every 1 Å of $SiO_2$ grown. Accordingly, in practice, an initial calculated target oxide profile could be evaluated for feasibility by starting with this value. If the target profile is so non-uniform that it would require extreme temperature/flow/pressure distributions (i.e., beyond what is safe for the chamber and/or capable of being sustained by the wafer itself without damage) then the value can be lowered from 43% until a more reasonable oxide target is determined.

Figure 12:
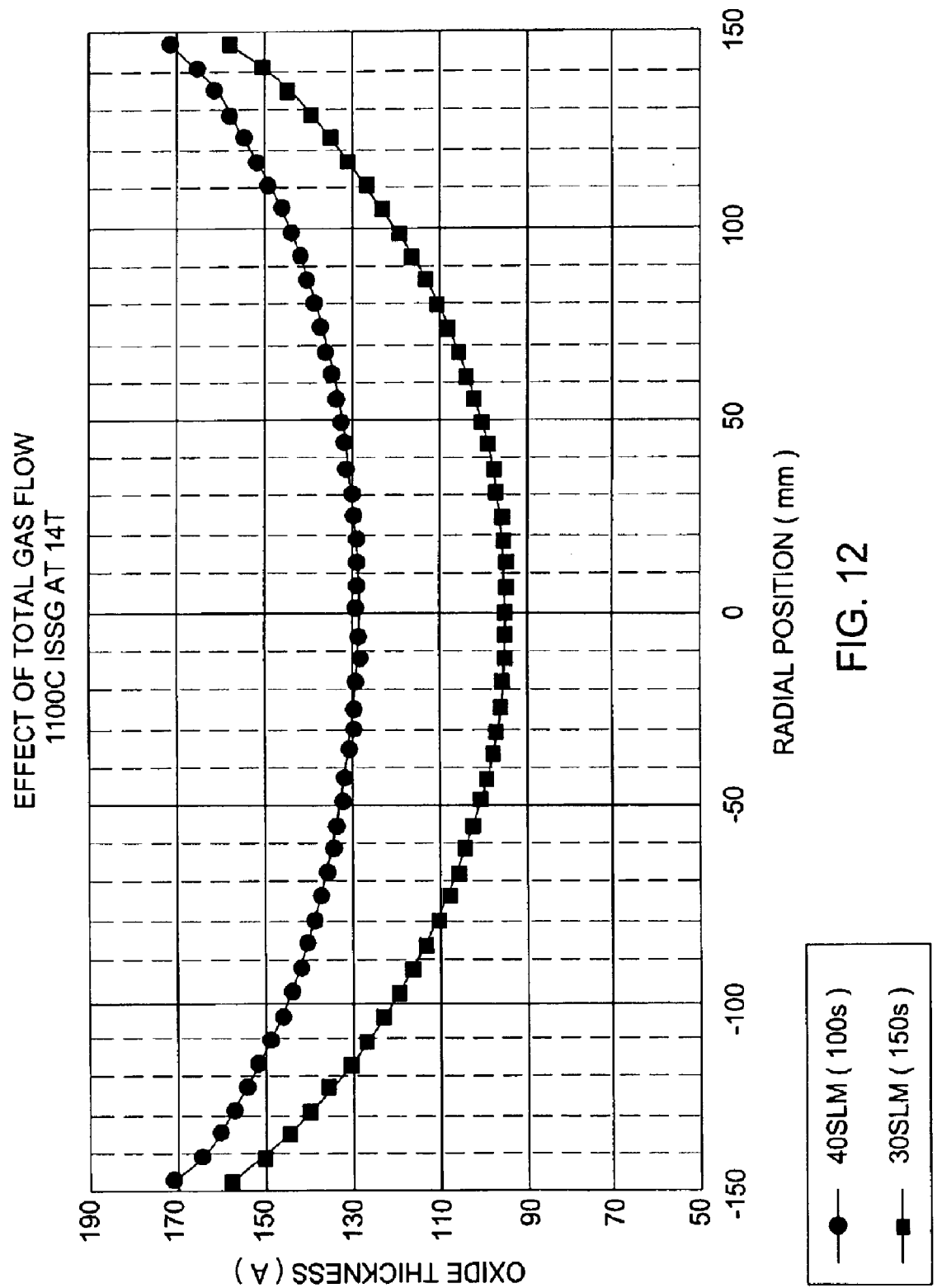
FIG. 12 is a plot illustrating the effect of total gas flow on oxide thickness.

Referring to FIG. 12, the effect of gas flow on oxide thickness profile is illustrated. The gas flow rates indicated in FIG. 12 are total gas flow rates, where percentages of $H_2$ and $O_2$ are 33% and 66%, respectively. In particular, FIG. 12 shows the oxide thickness of (i) a wafer processed with 40 slm and a soak/process time (step 310 of FIG. 4) of 100 seconds and (ii) a wafer processed with 30 slm and a soak/process time of 150 seconds. Both wafers show a similar U-shaped profile. However, the wafer processed at the higher gas flow rate (40 slm) has a flatter, more uniform profile with a higher growth rate. As such, embodiments of the present invention are preferably implemented using lower flow rates. In general, total flows may vary from about 5 SLM to 40 SLM. Preferably, the flow rate is between about 10 SLM and about 40 SLM. The soak time is preferably between about 30 seconds and about 90 seconds.

Figure 13:
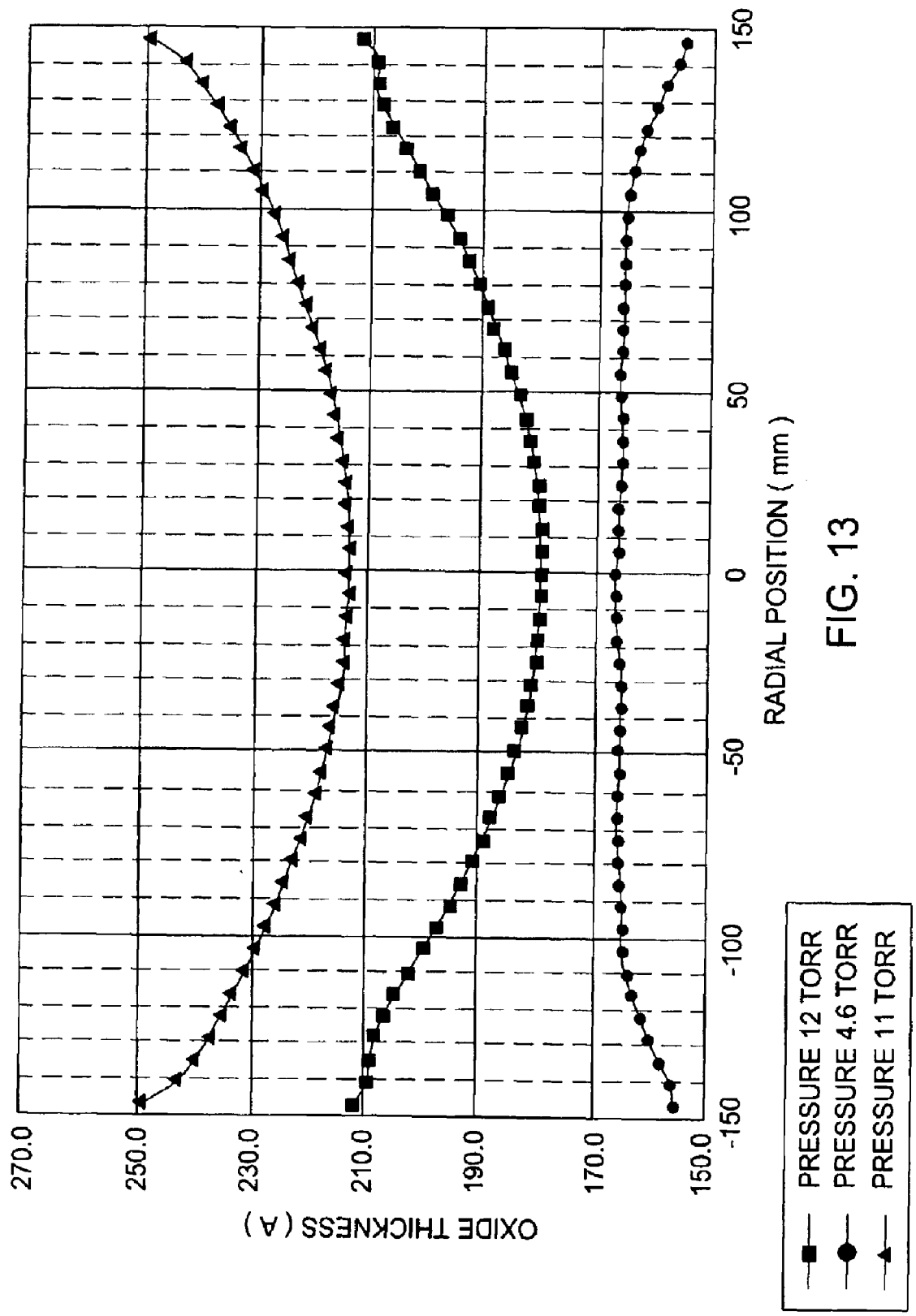
FIG. 13 is a plot illustrating the effect of pressure on oxide thickness.

Referring to FIG. 13, the effect of pressure on oxide thickness profile is illustrated. Illustratively, FIG. 13 shows the oxide thickness for three total pressures, 11 Torr, 12 Torr, and 4.6 Torr. The process temperature was 1100° C. held for 60 seconds with 40 SLM total flow at 33% $H_2$ and 66% $O_2$. In addition to illustrating the oxide growth rate inversion described above (the oxide thickness and 11 Torr is greater than the oxide thickness at 12 Torr, while the oxide thickness at 4.6 Torr is less than the thickness at both 11 Torr and 12 Torr), FIG. 13 illustrates that the oxide thickness profile changes with pressure. For example, at 4.6 Torr the profile exhibits a center-flat (or slightly center-thick) characteristic with a tapering off at the edges. In contrast, the profiles at 11 and 12 Torr are center-thin (U-shaped) and exhibit increasing thickness at the edges. As such, all else being equal (i.e., temperature/total gas/concentrations, etc.), higher pressure makes the profile more edge-thick (U-shaped) while lowering the pressure makes the profile more center-thick. Preferably, the chamber pressure is between about 6 Torr and about 14 Torr.

Figure 14:
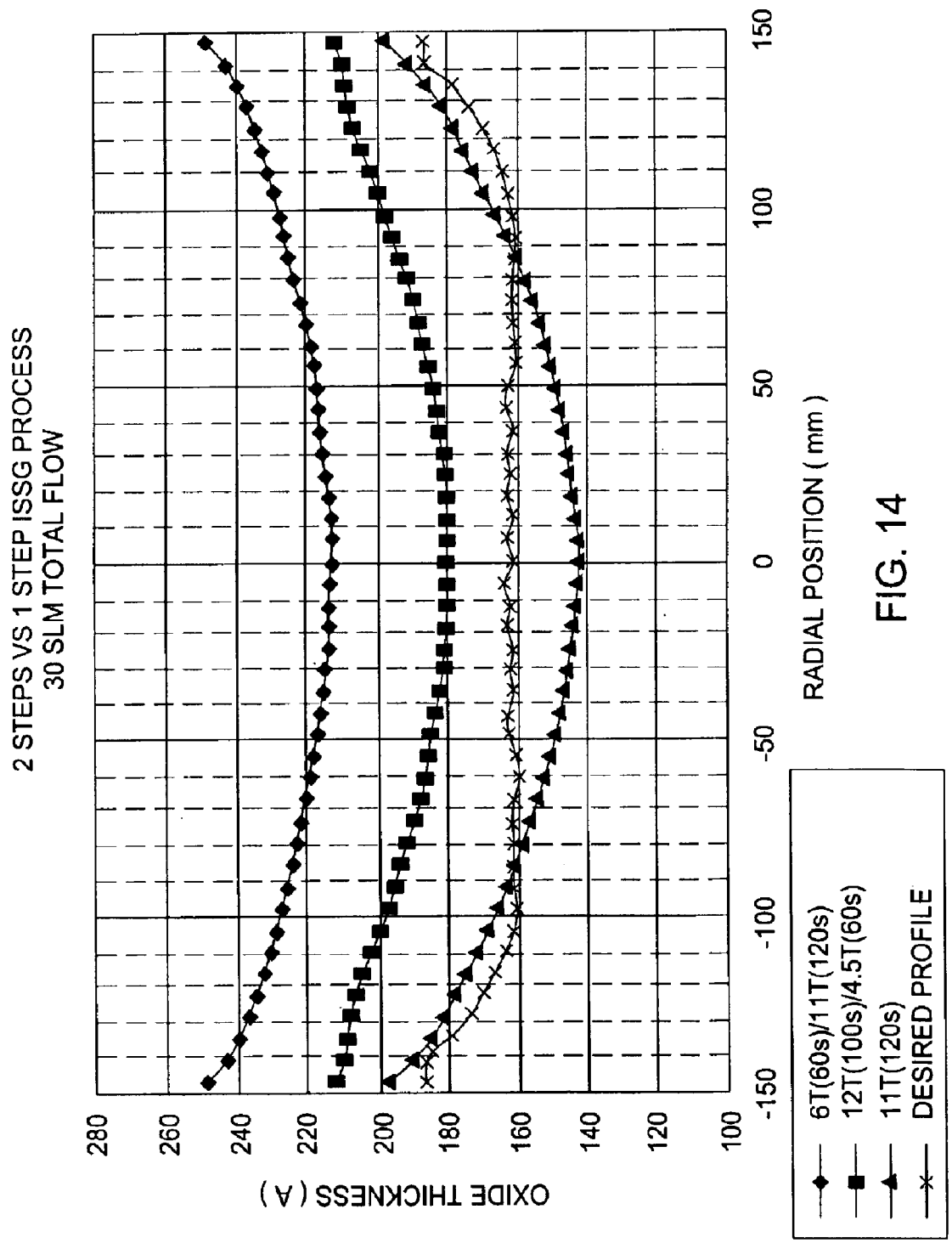
FIG. 14 is a plot illustrating the effect of a two-step pressure varied process on oxide thickness.

As noted above, it may be advantageous to perform successive oxide growth steps, with different parameter values or with the same process parameters. For example, because the oxide growth is a diffusion process rather than a chemical deposition process, the combination of two successive growth steps at different pressures give a result different than the simple sum of two independent processes. By way of illustration and example, FIG. 14 shows the oxide profiles where oxide was grown using two successive growth steps at different pressures. Specifically, (i) one wafer was processed at 6 Torr for 60 seconds and then 11 Torr for 120 seconds and (ii) a second wafer was processed at 12 Torr for 100 seconds and then 4.5 Torr for 60 seconds. For comparison, a third curve is shown representing a wafer processed at 11 Torr for 120 seconds. All wafers were processed with 30 slm of total flow.

Referring still to FIG. 14, it can be seen that processing a wafer first at a high pressure, then at a low pressure (e.g., 12T for 100s, 4.5T for 60s) results in a profile that is U-shaped, but that levels off near the wafer edge. The profile of the wafer processed with low pressure first, then high pressure (e.g., 6T for 60s, 11T for 120s) is similar to the one step high pressure profile (i.e., the wafer processed at 11T for 120s) except that at a radius greater than 140 mm the thickness increases.

Regarding temperature, it was determined that increasing temperature results in an increasing rate of oxidation, in both dry RTO processes and wet RTO processes (i.e., the in situ and ex situ steam generation process described above). Accordingly, the thermally controllable zones of the apparatus 200 facilitate growing an oxide layer having a desired profile, once the initial silicon profile is known. That is, in those areas of relatively thicker silicon, the corresponding zone temperature can be increased relative to those areas of relatively thinner silicon. One limitation to the use of thermal control is the possible introduction of slip into the substrate. Slip is an atomic scale defect of the single crystal structure of the silicon which can adversely affect the devices printed on it. Slip can be created in several ways but a common cause is a temperature gradient on the substrate while the substrate is at high temperature. Accordingly, the temperature gradient resulting across the thermal zones must be controlled to avoid causing slip. In one embodiment, the average process temperature may be between about 600° C. and 1250° C. and preferably between about 1000° C. and about 1150° C. However, the particular process temperature which may be used to achieve a desired result is largely dependent on a variety of factors including pressure, wafer material(s), the within-wafer-temperature gradient, etc.

The relative concentrations of the constituents of the oxidation mixture in the described ISSG process can also be manipulated to affect the oxide thickness profile. Generally, a relatively lower concentration of H2 will produce a flatter profile, while a relatively higher concentration of H2 will produce a profile which tapers down at the edge. Preferably, an oxidizing mixture concentration is between about 10% and about 33% $H_2$.

Figure 17:
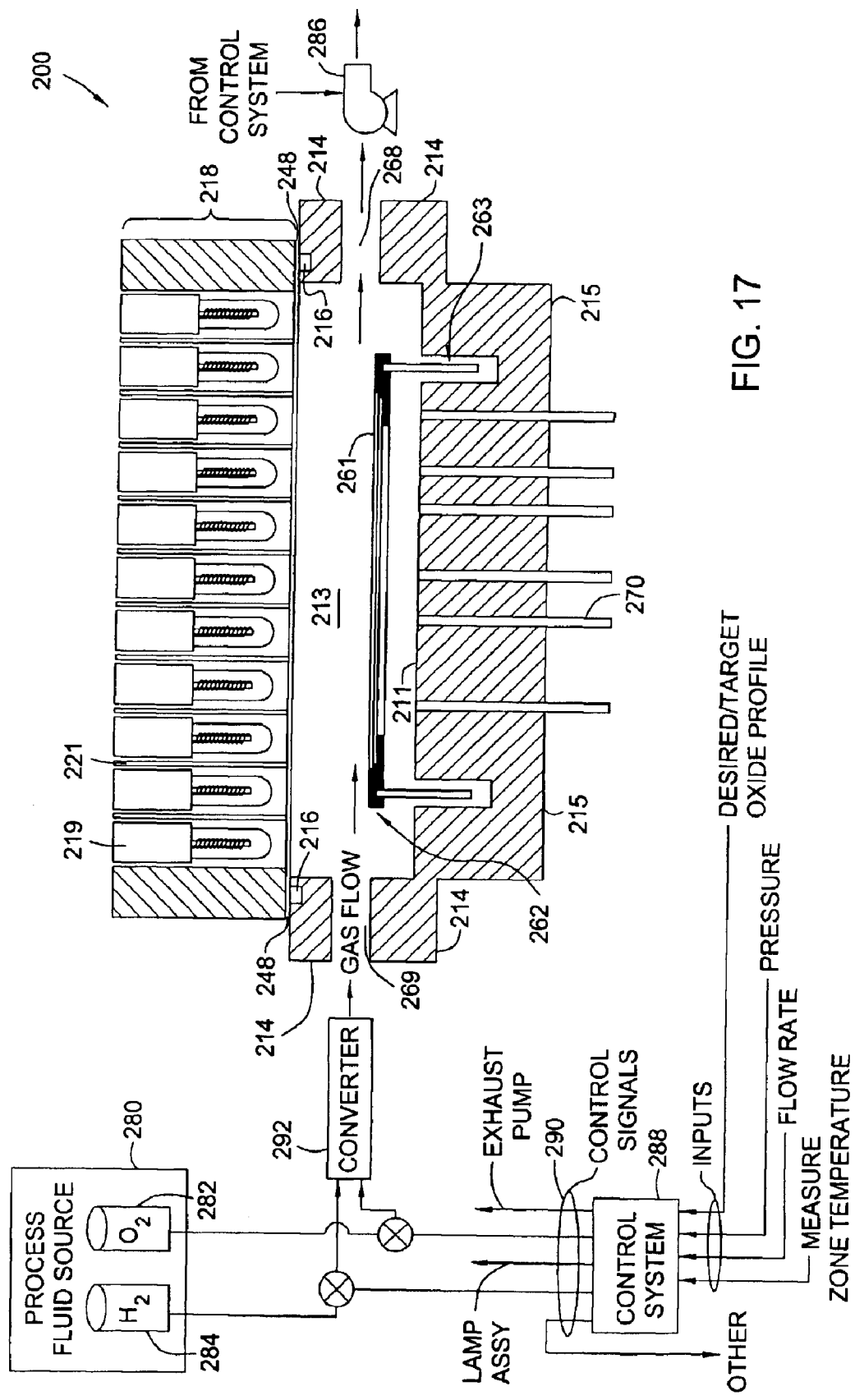
FIG. 17 is one embodiment of a rapid thermal heating apparatus which can implement an oxidation process according to embodiments of the present invention.

The foregoing embodiments describe a steam generation process in which water vapor is formed insitu, i.e., within the process region containing the wafer to be processed. However, in another embodiment, the water vapor is formed outside the process region containing the wafer and then introduced into the processing region (this process has been referred to herein as the ex situ or external steam generation process). FIG. 17 shows one embodiment of a system configured for such an external steam generation process. For brevity, like numerals identify like components previously described with respect to FIG. 2. Accordingly, these previously described components will not be described in detail again. A notable difference between the chamber of FIG. 2 and the system of FIG. 17 is the provision of a converter 292 disposed between the process fluid source 280 and the process chamber 213. Generally, the converter 292 is a thermal unit capable of heating fluid(s) input to the converter. In a particular embodiment, the converter 292 is a Water Vapor Generator available from Fujikin Incorporated. In the illustrative embodiment, the converter 292 takes as inputs the oxidizing mixture components, hydrogen and oxygen. The converter 292 then heats the hydrogen and oxygen which react to form steam. To this end, the converter 292 may be operable at an internal temperature of between about 200° C. and about 500° C. The steam generated in the converter 292 is then flowed into the chamber where it reacts with a wafer to form an oxide thereon.

The process parameter values for the reaction occurring with the chamber may generally be the same as those described above with respect to the in situ steam generation process. However, a notable difference between the two wet RTO processes (in situ and ex situ) is that ex situ may be performed at atmospheric conditions, while the in situ steam generation process is performed at subatmospheric conditions. This is so because detonation within the reaction chamber is not a concern in the case of the ex situ steam generation process. Further, the higher operating pressure of the ex situ steam generation process advantageously achieves a faster oxide growth rate relative to the in situ steam generation process. A further difference between in situ and ex situ steam generation processes is that the primary parameter manipulated to control the oxide growth profile on a substrate in the case of ex situ steam generation, is temperature. However, other aspects of the ex situ steam generation process can also be controlled such as, for example, the mixture concentration in the reaction chamber. For example, additional oxygen may be separately introduced into the chamber and allowed to combine with the steam present therein.

Although the steam generation process (in situ and external) has been described with respect to a vapor of a specific reactive species, i.e., water, it is to be appreciated that the teachings of the present invention can be applied to other processes forming a vapor of a reactive species. The reactive species vapor can then be reacted with the wafer or with films formed thereon to carry out processes such as film growth. For example, the steam generation process of the present invention can be utilized to convert a silicon dioxide ($SiO_2$) film into a robust silicon-oxy-nitride film. For example, a reactant gas mixture comprising ammonia ($NH_3$) and oxygen ($O_2$) can be fed into a chamber and then caused to react by heating a wafer to a sufficient temperature to initiate a reaction of the gasses to form nitric oxide (NO) in vapor form. The nitric oxide vapor can then be caused to react with an oxide film formed on the wafer to form a silicon-oxy-nitride film. Silicon-oxy-nitride films have been found to provide robust gate dielectric layers at thicknesses less than 100 angstroms. Other applications for the steam generation process of the present invention will be evident to those skilled in the art.

It is again emphasized that those oxide growth processes described in detail herein are merely illustrative, and any method or apparatus for forming an oxide in a controlled manner according to a surface topography is considered within the scope of the invention. Further, any of the oxide growth processes of the invention may be used in combination with one another. For example, the steam generation processes may be used in combination with a dry RTO process, where oxide growth is thermally controlled. That is, a wafer may be placed in the apparatus 200 and then exposed to an oxygen-containing environment by allowing oxygen to flow from the oxygen source 282, while controlling lamp assembly 218 to produce a thermal gradient over the radius of the substrate. The profile of the thermal gradient is selected to match the profile of the silicon material, thereby causing the growth of silicon dioxide wafer. In a particular embodiment, oxygen is flowed into the chamber at a rate of between about 5 SLM and about 30 SLM. The processing chamber may be stabilized at a pressure of about 760 Torr. The thermal zones T1–T7 are controlled to establish a temperature gradient over the wafer. The particular gradient will vary according to a desired profile and according to various other parameters and conditions, such as the material of the wafer. Further, a "gradient" as used herein need not be a linear change in temperature with respect to the wafer radius. Rather, "gradient" refers to a non-uniform temperature across the radius. Thus, a wafer maybe cooler in the central region and the edge relative to a warmer middle region. The substrate is processed for a period of time between about 5 seconds and about 600 seconds. Subsequently, and in the same chamber (or another chamber), the wafer may be processed according to the steam generation processes disclosed herein. Alternatively, a steam generation process may be performed first, i.e., the dry RTO process is performed after a steam generation process. Persons skilled in the art will recognize that any variety of oxide growth processes and combinations of such processes are made possible by, and within the scope of, the present invention.

As noted above, the oxide growth processes of the present invention may be applied to, for example, SOI wafers and Epi wafers. Both SOI and Epi wafers may be processed according to a multistep oxide growth process that includes a dry oxidation step (i.e., dry RTO with a temperature gradient) and a steam generation step (where the steam generation may be in situ or ex situ as defined herein). Further, the wafer temperature during the steam generation step may be controlled to achieve a uniform or non-uniform temperature radially over the wafer. Both the order and the number of iterations of each step may be varied to achieve a desired result. The following is an example of a steam generation process with uniform wafer temperature and a subsequent steam generation process with non-uniform wafer temperature.

Example of ISSG Process in Combination with Temperature Control

A total of six 300 mm SOI wafers were processed. Prior to processing the SOI wafers, thirteen P on P⁻ Epi Si wafers were used for tuning and setup. The objective was to demonstrate growth of a non-uniform sacrificial oxide film thickness profile to compensate for non-uniform silicon layer thickness of SOI wafers. The silicon layer on the SOI wafer was thicker at the edge of the wafer. Thus, the goal was to make the oxide layer also thicker at the edge in order to make the silicon layer more uniform after the oxide is stripped. The target thickness was 160 Å in the central region of the wafer, climbing to 190 Å at the wafer edge. The ISSG process was tuned for the desired non-uniform oxide thickness profile by varying total gas flow, pressure, and soak time using Epi tuning wafers. As summarized in Table I below, the nominal ISSG process was performed at 14 Torr with a soak at 1100° C. for 130 seconds, with a 40 slm total gas flow with 33% Hydrogen and 67% Oxygen during recipe steps 2 through 7 (corresponding to steps 306 through 310 of FIG. 4). Thus, for 30 slm total gas flow, there is 9.9 slm Hydrogen and 20.1 slm Oxygen.

TABLE I

SUMMARY OF NOMINAL PROCESS

| Step | Temperature and Pressure conditions |
| --- | --- |
| Wafer Entry power: | Zones 1–8: 20%, Zone 9: 18%, Zones 10–15: 5% |
| Open Loop power: | Zones 1–8: 26%, Zone 9: 23%, Zones 10–15: 5% |
| 1. Pumpdown | Pump down to 1 T; Open Loop constant voltage |
| 2. Backfill | Backfill to 14 T; Constant voltage until T > 400° C. |
| 3. Ramp | Ramp Temperature to 600° C. at 10° C./s |
| 4. Stabilize | Hold temperature 600° C. for 15 s |
| 5. Ramp | Ramp Temperature to 1100° C. at 75° C./s |
| 7. Soak/Process Time | Hold Temperature 1100° C. for 130 s |
| 8. Ramp & Pumpdown | Ramp down to 690° C. at 30° C./s and pump down to 3 Torr |
| 9. Cool | Constant voltage 5% for 20 sec with 10 slm $N_2$; backfill to 10 T |

Figure 15:
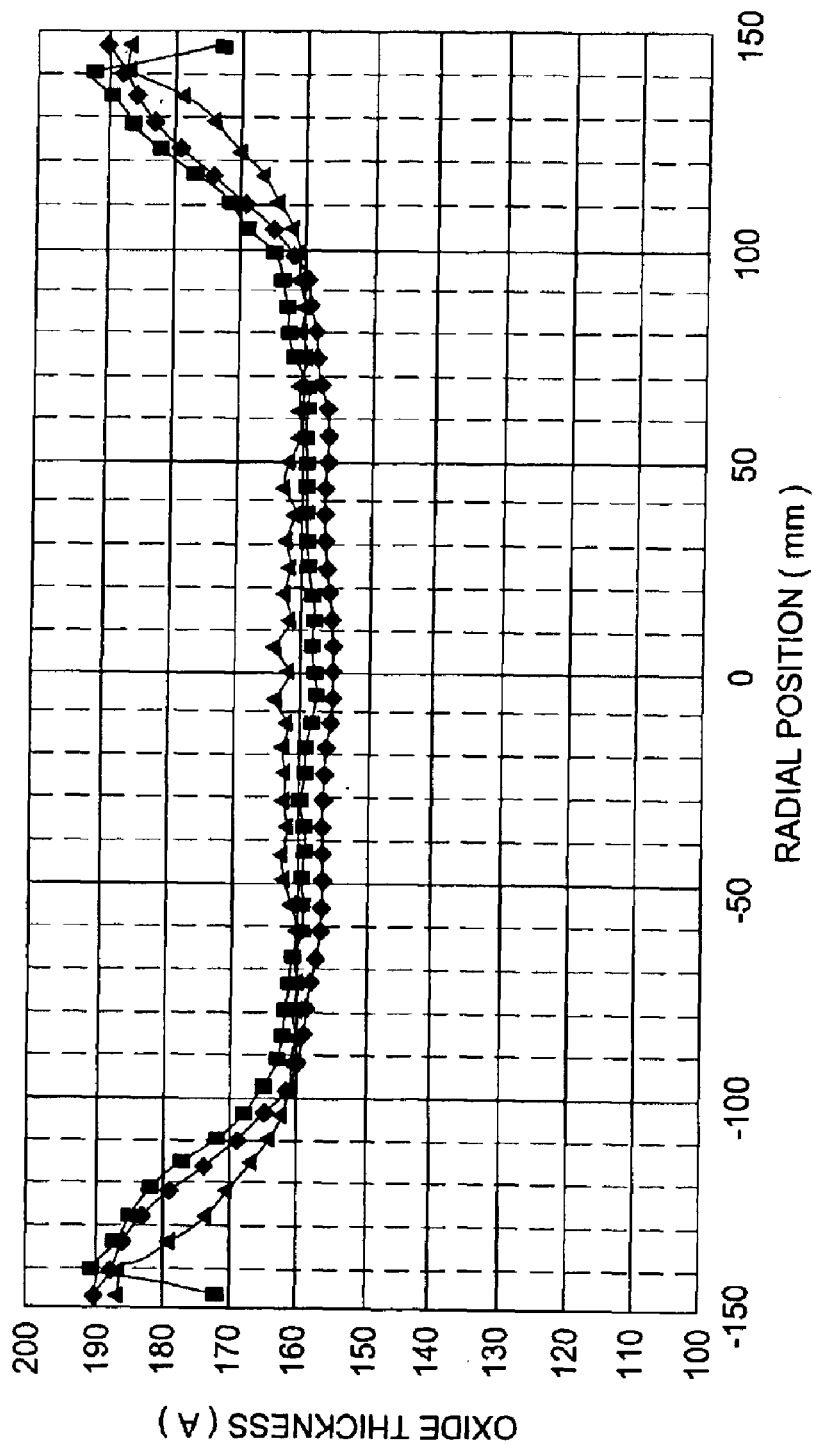
FIG. 15 compares the desired oxide thickness profile to the experimental results for two test wafers.

Pressure and flow based processes alone achieved a particular profile. Subsequently, the temperatures of the various zones were adjusted to flatten the profile in the wafer central region. The particular temperature adjustments for zones T1 through T7 were selected to give the best fit to the desired profile, without introduction of slip. Specifically, the following temperature adjustments were made to the zone temperatures to give slip-free performance on an Epi tuning wafer: +2.0° C. (T1), +4.8° C. (T2), −0.5° C. (T3), +1.5° C. (T4), −8.0° C. (T5), −5.0° C. (T6), and −8.0° C. (T7). The corresponding profiles are shown in FIG. 15.

Figure 16:
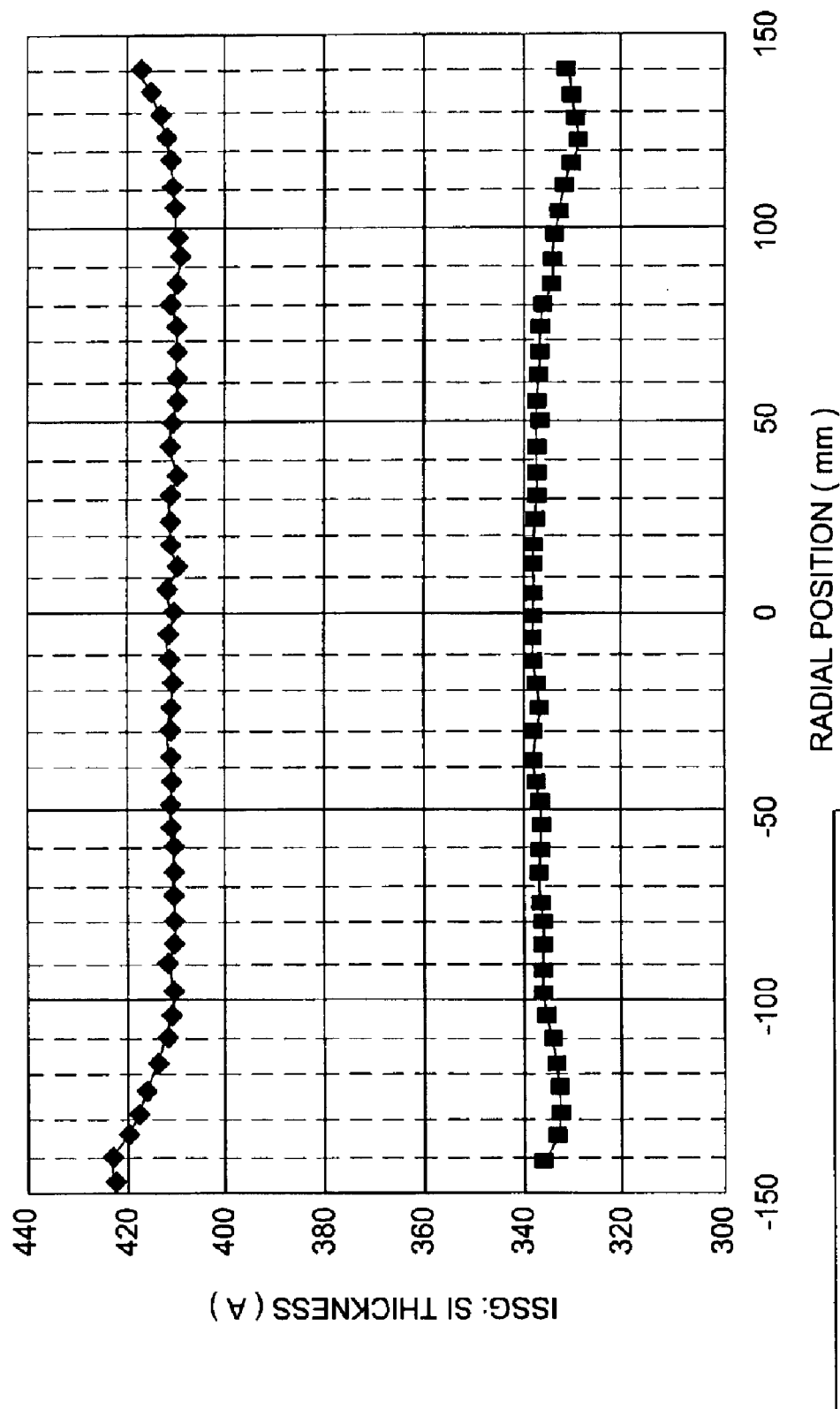
FIG. 16 shows a plot of experimental results illustrating an improvement in silicon profile uniformity.

Following formation of the oxide, the wafers were placed in a 100:1 HF dip for 1800 seconds, then rinsed and dried. The silicon layer thickness measurements were made using an analysis of a three-layer ($SiO_2$—Si—$SiO_2$— Substrate) film stack in which there could be some convolution of the two oxide layers. The thickness range of an Epi wafer was reduced from 13.9 Å to 9.7 Å, as shown in FIG. 16. For this example, all silicon and oxide thicknesses were measured by a ThermaWave Optiprobe Ellipsometer/Reflectometer tool.

While the foregoing is directed to embodiments of the present invention, other and further embodiments of the invention may be devised without departing from the basic scope thereof, and the scope thereof is determined by the claims that follow.

What is claimed is:

1. A method of growing a sacrificial planarization layer on a material forming an upper surface of a semiconductor wafer, comprising:
   (a) determining a non-uniform thickness profile of the material;
   (b) selecting one or more process parameter values based on the non-uniform thickness profile in order to planarize the material; and
   (c) growing, by wet oxidation, the sacrificial planarization layer on the upper surface of the wafer according to the non-uniform thickness profile and the selecting one or more process parameter values, wherein the sacrificial planarization layer consumes a portion of the material to effect planarization thereof.

2. The method of claim 1, wherein selecting one or more process parameter values comprises selecting at least one of a wafer temperature value, a gas flow rate, a chamber pressure and a processing time.

3. The method of claim 1, wherein selecting one or more process parameter values comprises selecting a wafer temperature value of between about 600° C. and about 1250° C.

4. The method of claim 1, wherein selecting one or more process parameter values comprises selecting an oxygen gas flow rate of between about 2 SLM and about 50 SLM.

5. The method of claim 1, wherein selecting one or more process parameter values comprises selecting a wafer temperature value of between about 1000° C. and about 1150° C. an oxidizing gas flow rate of between about 10 SLM and about 40 SLM, a chamber pressure of between about 6 Torr and about 14 Torr, a processing time of between about 30 second and about 90 seconds and an oxidizing mixture concentration having between about 10% and about 33% $H_2$.

6. The method of claim 1, wherein the sacrificial planarization layer is an oxide.

7. The method of claim 1, wherein the material is silicon and the sacrificial planarization layer is silicon dioxide.

8. The method of claim 1, wherein the wafer is a Silicon-On-Insulator wafers.

9. The method of claim 1, wherein growing by wet oxidation comprises exposing the material to steam.

10. The method of claim 9, wherein the steam is generated in situ by thermal energy from the wafer.

11. The method of claim 9, wherein the steam is generated ex situ and then delivered into a reaction area containing the wafer.

12. The method of claim 1, further comprising:
    (d) removing the sacrificial planarization layer.

13. The method of claim 12, further comprising iteratively growing and removing sacrificial planarization layers on the wafer.

14. The method of claim 12, further comprising repeating the steps (a)–(d).

15. A method of planarizing an upper silicon-containing layer of a wafer, the method comprising:
    determining a target oxide profile of the wafer;
    based on the target oxide profile, selecting one or more process parameter values, wherein the process parameter values are selected from at least one of a chamber pressure and a fluid mixture fluid flow rate of an oxidizing fluid mixture comprising an oxygen-containing fluid and a hydrogen-containing fluid;
    placing the wafer in an oxide growth chamber;
    flowing the oxidizing fluid mixture into the chamber at a chamber pressure of between about 6 Torr and about 14 Torr;
    ramping the wafer temperature to between about 10° C./sec and about 100° C./sec;
    maintaining the chamber pressure and the wafer temperature in the oxide growth for a period of time between about 30 seconds and about 90 seconds;
    controlling wafer temperature and at least one of chamber pressure, flow rate of the oxidizing fluid mixture and concentration of the oxidizing fluid mixture concentration to cause planarizing consumption of the silicon-containing layer according to the target oxide profile and cause growth of the sacrificial planarization layer on the silicon-containing layer; and
    removing the sacrificial planarization layer.

16. The method of claim 15, wherein removing the sacrificial planarization layer comprises placing the wafer in a hydrogen-fluoride (HF) dip.

17. The method of claim 15, wherein the oxidizing fluid mixture comprises steam.

18. The method of claim 15, further comprising, thermally activating the oxidizing fluid mixture to form steam.

19. The method of claim 15, further comprising iteratively forming and removing sacrificial planarization layers on the wafer.

* * * * *

UNITED STATES PATENT AND TRADEMARK OFFICE
CERTIFICATE OF CORRECTION

PATENT NO. : 6,916,744 B2  
APPLICATION NO. : 10/325673  
DATED : July 12, 2005  
INVENTOR(S) : Vedapuram S. Achutharaman, Juan Chacin and Hali Forstner Page 1 of 1

It is certified that error appears in the above-identified patent and that said Letters Patent is hereby corrected as shown below:

Column 8, Line 14: After "Centura®", delete ")"

Column 9, Line 33: Change "too" to --tool--

Column 12, Line 25: Change "Ti" to --T1--

Column 12, Line 26: Change "17" to --T7--

Column 19, Line 27: After "thickness", change "and" to --at--

Column 21, Line 60: Change "maybe" to --may be--

In the Claims

Column 23, Claim 5, Line 46: Insert a comma before "an oxidizing"

Column 23, Claim 5, Line 49: Change "second" to --seconds--

Column 24, Claim 8, Line 2: Change "wafers to --wafer--

Signed and Sealed this

Twenty-eighth Day of November, 2006

JON W. DUDAS  
*Director of the United States Patent and Trademark Office*